(12) United States Patent
Xiao

(10) Patent No.: US 11,605,644 B2
(45) Date of Patent: Mar. 14, 2023

(54) MEMORY STACKS HAVING SILICON NITRIDE GATE-TO-GATE DIELECTRIC LAYERS AND METHODS FOR FORMING THE SAME

(71) Applicant: YANGTZE MEMORY TECHNOLOGIES CO., LTD., Wuhan (CN)

(72) Inventor: Li Hong Xiao, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 9 days.

(21) Appl. No.: 16/455,638

(22) Filed: Jun. 27, 2019

(65) Prior Publication Data

US 2020/0312868 A1 Oct. 1, 2020

Related U.S. Application Data

(63) Continuation of application No. PCT/CN2019/080445, filed on Mar. 29, 2019.

(51) Int. Cl.
| | |
|---|---|
| *H01L 27/11582* | (2017.01) |
| *G11C 16/04* | (2006.01) |
| *H01L 29/423* | (2006.01) |
| *H01L 29/66* | (2006.01) |
| *H01L 29/792* | (2006.01) |

(52) U.S. Cl.
CPC .... *H01L 27/11582* (2013.01); *G11C 16/0466* (2013.01); *G11C 16/0483* (2013.01); *H01L 29/42352* (2013.01); *H01L 29/66833* (2013.01); *H01L 29/7926* (2013.01)

(58) Field of Classification Search
CPC ......... H01L 27/11582; H01L 29/42352; H01L 29/66833; H01L 29/7926; G11C 16/0466; G11C 16/0483
See application file for complete search history.

(56) References Cited

U.S. PATENT DOCUMENTS

| | | | |
|---|---|---|---|
| 9,576,967 B1 * | 2/2017 | Kimura | ............ H01L 27/11582 |
| 9,673,216 B1 | 6/2017 | Baraskar et al. | |
| 2010/0109065 A1 | 5/2010 | Oh et al. | |
| 2012/0037977 A1 | 2/2012 | Lee et al. | |
| 2015/0076586 A1 * | 3/2015 | Rabkin | ............ H01L 27/11578 |
| | | | 257/324 |
| 2016/0005760 A1 | 1/2016 | Lee et al. | |

(Continued)

FOREIGN PATENT DOCUMENTS

| | | |
|---|---|---|
| CN | 105493266 A | 4/2016 |
| CN | 106298785 A | 1/2017 |

(Continued)

*Primary Examiner* — Shaun M Campbell
(74) *Attorney, Agent, or Firm* — Bayes PLLC

(57) ABSTRACT

Embodiments of 3D memory devices and methods for forming the same are disclosed. In an example, a 3D memory device includes a substrate, a memory stack, and a NAND memory string. The memory stack includes a plurality of interleaved gate conductive layers and gate-to-gate dielectric layers above the substrate. Each of the gate-to-gate dielectric layers includes a silicon nitride layer. The NAND memory string extends vertically through the interleaved gate conductive layers and gate-to-gate dielectric layers of the memory stack.

19 Claims, 25 Drawing Sheets

(56) References Cited

U.S. PATENT DOCUMENTS

| | | | |
|---|---|---|---|
| 2016/0148949 A1* | 5/2016 | Jayanti | H01L 21/022 |
| | | | 257/314 |
| 2016/0204117 A1* | 7/2016 | Liu | H01L 27/11551 |
| | | | 257/324 |
| 2017/0084626 A1* | 3/2017 | Kim | H01L 23/485 |
| 2017/0110472 A1 | 4/2017 | Hu | |
| 2017/0125436 A1 | 5/2017 | Sharangpani et al. | |
| 2017/0154892 A1* | 6/2017 | Oh | H01L 23/5283 |
| 2017/0278859 A1 | 9/2017 | Sharangpani et al. | |
| 2017/0352681 A1 | 12/2017 | Lee | |
| 2018/0076208 A1 | 3/2018 | Sakuma et al. | |
| 2018/0182771 A1* | 6/2018 | Costa | H01L 27/1157 |
| 2019/0312035 A1* | 10/2019 | Takuma | H01L 27/11529 |

FOREIGN PATENT DOCUMENTS

| | | |
|---|---|---|
| CN | 107611129 A | 1/2018 |
| CN | 107946310 A | 4/2018 |
| CN | 109155316 A | 1/2019 |
| CN | 109314147 A | 2/2019 |
| CN | 109417074 A | 3/2019 |
| CN | 109496360 A | 3/2019 |
| CN | 109509698 A | 3/2019 |
| KR | 20160140467 A | 12/2016 |
| TW | 201719816 A | 6/2017 |
| TW | I653743 B | 3/2019 |

\* cited by examiner

MEMORY STACKS HAVING SILICON NITRIDE GATE-TO-GATE DIELECTRIC LAYERS AND METHODS FOR FORMING THE SAME

CROSS REFERENCE TO RELATED APPLICATION

This application is continuation of International Application No. PCT/CN2019/080445, filed on Mar. 29, 2019, entitled "MEMORY STACKS HAVING SILICON NITRIDE GATE-TO-GATE DIELECTRIC LAYERS AND METHODS FOR FORMING THE SAME," which is hereby incorporated by reference in its entirety. This application is also related to U.S. application Ser. No. 16/455,634, filed on even date, entitled "MEMORY STACKS HAVING SILICON OXYNITRIDE GATE-TO-GATE DIELECTRIC LAYERS AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack, and a NAND memory string. The memory stack includes a plurality of interleaved gate conductive layers and gate-to-gate dielectric layers above the substrate. Each of the gate-to-gate dielectric layers includes a silicon nitride layer. The NAND memory string extends vertically through the interleaved gate conductive layers and gate-to-gate dielectric layers of the memory stack.

In another example, a method for forming a 3D memory device is disclosed. a memory stack including a plurality of interleaved gate conductive layers and gate-to-gate dielectric layers above a substrate is formed. Each of the gate-to-gate dielectric layers includes a silicon nitride layer. A NAND memory string extending vertically through the interleaved gate conductive layers and gate-to-gate dielectric layers of the memory stack is formed. A slit structure extending vertically through the interleaved gate conductive layers and gate-to-gate dielectric layers of the memory stack is formed.

In still another example, a method for forming a 3D memory device is disclosed. A plurality of doped polysilicon layers and a plurality of silicon nitride layers are alternatingly deposited above a substrate. A channel structure extending vertically through the doped polysilicon layers and silicon nitride layers is formed. A slit opening extending vertically through the doped polysilicon layers and the silicon nitride layers is etched. An etch-back recess is etched in each of the doped polysilicon layers abutting a sidewall of the slit opening. A dielectric layer is deposited in the etch-back recesses and along the sidewall of the slit opening.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
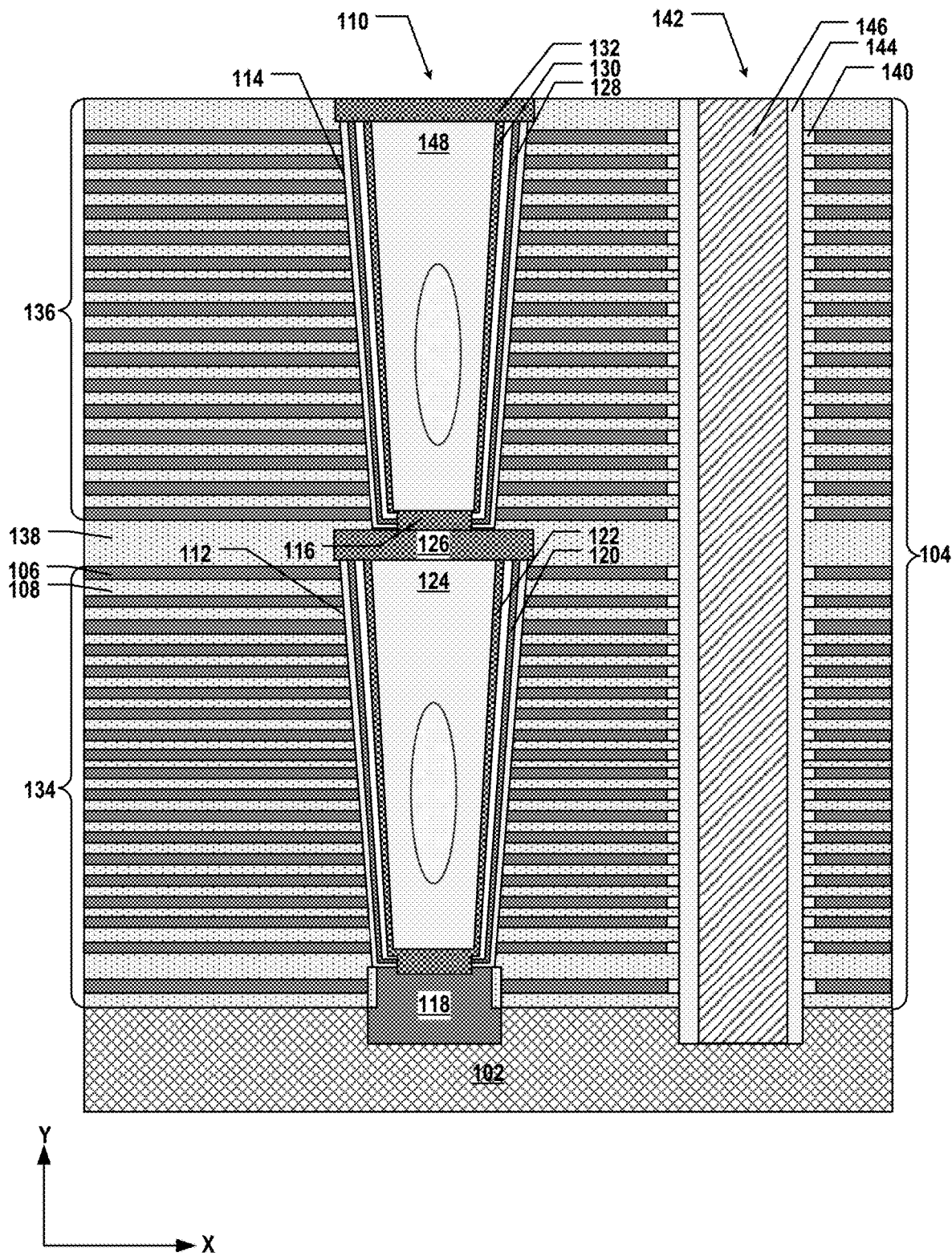
FIG. 1A illustrates a cross-section of an exemplary 3D memory device with a memory stack having silicon oxynitride gate-to-gate dielectric layers, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

3D memory devices, such as 3D NAND memory devices, can be vertically scaled-up by forming more films (e.g., metal gate conductive layers and silicon oxide gate-to-gate dielectric layers) in the memory stack having a multi-deck architecture. A number of high-temperature thermal processes may be applied during the formation of memory strings extending through the multi-deck memory stack, such as thermal annealing for releasing stress after channel hole etching, hydrogen gas bake pre-treatment for silicon selective epitaxial growth (SEG), and the high-temperature SEG process itself (e.g., over 850° C.). The thermal budget for the films in the upper deck of the memory stack is less than the thermal budget for the films in the lower deck because the upper deck undergoes fewer high-temperature thermal processes during the fabrication processes. Due to the thermal budget difference, the quality of the silicon oxide gate-to-gate dielectric layers in the upper deck becomes worse than that in the lower deck, for example, with less oxide film shrinkage and looser film structure. Accordingly, during the later gate replacement process, which etches silicon nitride sacrificial layers, the silicon oxide films in the upper deck may have significant loss both laterally on the sidewalls of channel structures and vertically in the thickness of each silicon oxide gate-to-gate dielectric layer. The nonuniform silicon oxide film loss may reduce production yield and/or electrical performance of the 3D memory devices (e.g., with more gate-to-gate coupling and leakage problems).

Various embodiments in accordance with the present disclosure provide memory stacks having non-silicon oxide gate-to-gate dielectric layers and fabrication methods thereof. The non-silicon oxide gate-to-gate dielectric layers can include silicon oxynitride layers or silicon nitride layers. In some embodiments in which polysilicon layers are used as the sacrificial layers, the high etch selectivity between polysilicon and silicon nitride can avoid the thermal budget difference-induced upper-to-lower deck oxide loss during gate replacement. In some embodiments, since silicon nitride has a higher dielectric constant than that of silicon oxide, silicon nitride gate-to-gate dielectric layers can reduce the chance of gate-to-gate coupling and leakage. In some embodiments, a silicon nitride film may be further oxidized to become a silicon oxynitride film or even a multi-layer film including silicon oxynitride, which have better electrical barrier performance than silicon oxide films as gate-to-gate dielectric materials. As a result, production yield and electrical performance of 3D memory devices can be improved by the memory stacks having non-silicon oxide gate-to-gate dielectric layers disclosed herein.

FIG. 1A illustrates a cross-section of an exemplary 3D memory device 100 with a memory stack 104 having silicon oxynitride gate-to-gate dielectric layers, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. It is noted that x and y axes are included in FIG. 1A to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in the form of an array of NAND memory strings 110 each extending vertically above substrate 102. The memory array device can include NAND memory strings 110 that extend through a plurality of pairs each including a gate conductive layer 106 and a gate-to-gate dielectric layer 108. The interleaved gate conductive layers 106 and gate-to-gate dielectric layers 108 are part of memory stack 104. The number of the pairs of gate conductive layers 106 and gate-to-gate dielectric layers 108 in memory stack 104 (e.g., 32, 64, 96, or 128) determines the number of memory cells in 3D memory device 100. Memory stack 104 can include a plurality of interleaved gate conductive layers 106 and gate-to-gate dielectric layers 108. Gate conductive layers 106 and gate-to-gate dielectric layers 108 in memory stack 104 can alternate in the vertical direction. In other words, except the ones at the top or bottom of memory stack 104, each gate conductive layer 106 can be adjoined by two gate-to-gate dielectric layers 108 on both sides, and each gate-to-gate dielectric layer 108 can be adjoined by two gate conductive layers 106 on both sides. Gate conductive layers 106 can each have the same thickness or different thicknesses. Similarly, gate-to-gate dielectric layers 108 can each have the same thickness or different thicknesses.

Each gate conductive layer 106 can include conductive materials including, but not limited to, tungsten (W), cobalt (Co), copper (Cu), aluminum (Al), polysilicon, doped silicon, silicides, or any combination thereof. In some embodiments, each gate conductive layers 106 includes a metal layer, such as a tungsten layer. In some embodiments, each gate conductive layer 106 includes a doped polysilicon layer. Polysilicon can be doped to a desired doping concentration with any suitable dopant to become a conductive material that can be used as the material of gate lines. The thickness of each gate conductive layer 106 can be between about 10 nm and about 50 nm, such as between 10 nm and 50 nm (e.g., 10 nm, 15 nm, 20 nm, 25 nm, 30 nm, 35 nm, 40 nm, 45 nm, 50 nm, any range bounded by the lower end by any of these values, or in any range defined by any two of these values). Each gate conductive layer 106 can be a gate electrode (gate line) surrounding NAND memory string 110 and can extend laterally as a word line.

Different from some known 3D memory devices having silicon oxide gate-to-gate-dielectric layers (e.g., each gate-to-gate dielectric layer includes a single silicon oxide layer), 3D memory device 100 can use non-silicon oxide gate-to-gate dielectric layers in memory stack 104 to avoid thermal budget difference-induced upper-to-lower deck oxide loss as well as improve barrier performance with reduced gate-to-gate coupling and leakage. In some embodiments, each gate-to-gate dielectric layer 108 includes a silicon oxynitride layer (referred to herein as a "silicon oxynitride gate-to-gate dielectric layer"). Silicon oxynitride ($SiN_xO_y$) has a dielectric constant higher than that of silicon oxide, for example, between about 4 and about 7, such as between 4 and 7, at about 20° C. and thus, having better barrier performance than that of silicon oxide as the material of gate-to-gate dielectric layers. The thickness of gate-to-gate dielectric layer 108 can be between about 10 nm and about 50 nm, such as between 10 nm and 50 nm (e.g., 10 nm, 15 nm, 20 nm, 25 nm, 30 nm, 35 nm, 40 nm, 45 nm, 50 nm, any range bounded by the lower end by any of these values, or in any range defined by any two of these values).

Figure 2A:
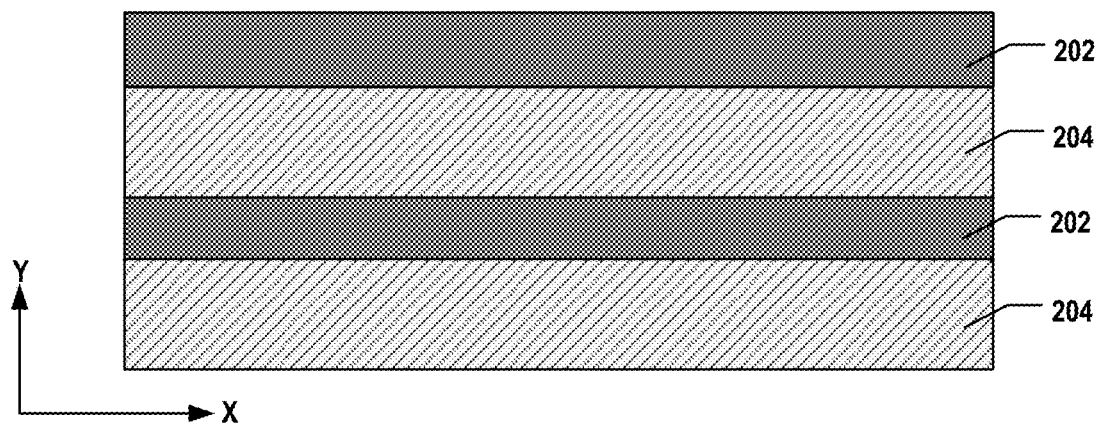
FIG. 2A illustrates a cross-section of an exemplary silicon oxynitride gate-to-gate dielectric layer, according to some embodiments of the present disclosure.
Figure 2B:
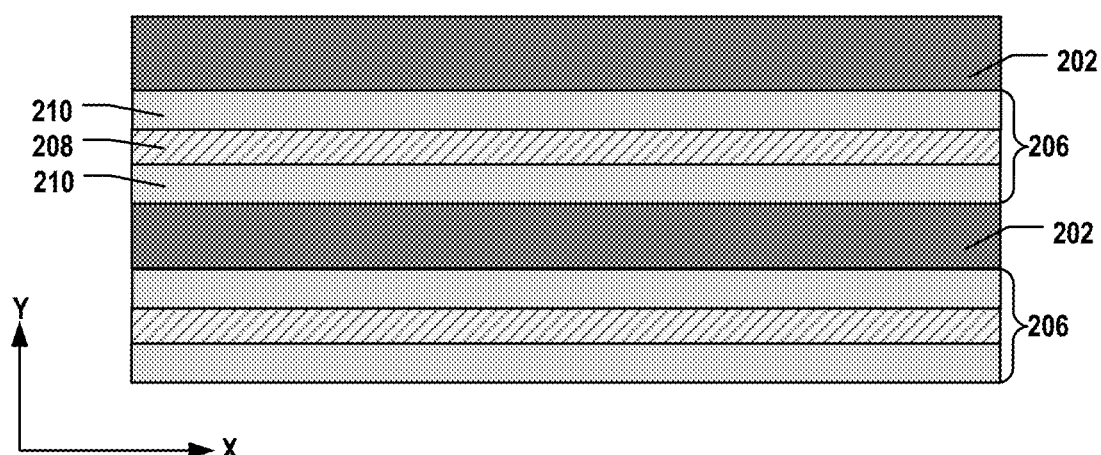
FIG. 2B illustrates a cross-section of another exemplary silicon oxynitride gate-to-gate dielectric layer, according to some embodiments of the present disclosure.

The structure of a silicon oxynitride gate-to-gate dielectric layer (e.g., gate-to-gate dielectric layer 108) can vary in different examples. FIG. 2A illustrates a cross-section of an exemplary silicon oxynitride gate-to-gate dielectric layer 204, according to some embodiments of the present disclosure. As shown in FIG. 2A, each silicon oxynitride gate-to-gate dielectric layer 204 stacked between two gate conductive layers 202 consists of a silicon oxynitride layer, i.e., is a single layer made of silicon oxynitride, according to some embodiments. FIG. 2B illustrates a cross-section of another exemplary silicon oxynitride gate-to-gate dielectric layer 206, according to some embodiments of the present disclosure. As shown in FIG. 2B, each silicon oxynitride gate-to-gate dielectric layer 206 stacked between two gate conductive layers 202 is a composite layer having multiple sub-layers at least one of which is a silicon oxynitride layer 208, according to some embodiments. That is, each gate-to-gate dielectric layer 206 can include silicon oxynitride layer 208 and at least one silicon oxide layer 210. As shown in FIG. 2B, each gate-to-gate dielectric layer 206 includes silicon oxynitride layer 208 stacked between two silicon oxide layers 210, according to some embodiments. In other words, gate-to-gate dielectric layer 206 can be a composite layer in the form of $SiO_2/SiO_xN_y/SiO_2$. It is understood that the number of silicon oxide layers in the composite layer is not limited as long as the composite layer includes at least one silicon oxynitride layer. As described below in detail, the composite layer structure of a silicon oxynitride gate-to-gate dielectric layer can be achieved by controlling the oxygen diffusion concentration in oxidizing silicon nitride layers.

Referring back to FIG. 1A, in some embodiments, memory stack 104 has a multi-deck architecture (e.g., a dual-deck architecture as shown in FIG. 1A), which includes a lower memory deck 134 above substrate 102 and an upper memory deck 136 above lower memory deck 134. The numbers of the pairs of gate conductive layers 106 and gate-to-gate dielectric layers 108 in each of lower and upper memory decks 134 and 136 can be the same or different. Each of lower and upper memory decks 134 and 136 can include interleaved gate conductive layers 106 and gate-to-gate dielectric layers 108 (each including a silicon oxynitride layer) as described above. Memory stack 104 can further include an inter-deck dielectric layer 138 between lower and upper memory decks 134 and 136. In some embodiments, inter-deck dielectric layer 138 includes the same materials as gate-to-gate dielectric layers 108, e.g., silicon oxynitride, and thus, is considered as part of lower memory deck 134 or upper memory deck 136.

As shown in FIG. 1A, NAND memory string 110 can include a lower channel structure 112 extending vertically through lower memory deck 134, an upper channel structure 114 extending vertically through upper memory deck 136, and an inter-deck plug 116 vertically between and in contact with lower channel structure 112 and upper channel structure 114, respectively. Lower channel structure 112 can include a channel hole filled with a semiconductor layer (e.g., as a semiconductor channel 122) and multiple dielectric layers (e.g., as a memory film 120). In some embodiments, semiconductor channel 122 includes silicon, such as amorphous silicon, polysilicon, or single-crystal silicon. In some embodiments, memory film 120 is a composite layer including a tunneling layer, a storage layer (also known as a "charge trap layer"), and a blocking layer. The remaining space of lower channel structure 112 can be partially or fully filled with a capping layer 124 including dielectric materials, such as silicon oxide. Lower channel structure 112 can have a cylinder shape (e.g., a pillar shape). Capping layer 124, semiconductor channel 122, the tunneling layer, storage layer, and blocking layer of memory film 120 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 120 can include a composite layer of silicon oxide/silicon oxynitride/silicon oxide (ONO). Similarly, upper channel structure 114 can include a memory film 128, a semiconductor channel 130, and a capping layer 148 arranged radially from the center toward the outer surface of the pillar in this order.

In some embodiments, lower channel structure 112 further includes a semiconductor plug 118 in the lower portion (e.g., at the lower end) of lower channel structure 112. As used herein, the "upper end" of a component (e.g., lower channel structure 112) is the end farther away from substrate 102 in the y-direction, and the "lower end" of the component (e.g., lower channel structure 112) is the end closer to substrate 102 in they-direction when substrate 102 is positioned in the lowest plane of 3D memory device 100. Semiconductor plug 118 can include a semiconductor material, such as silicon, which is epitaxially grown from substrate 102 in any suitable directions. It is understood that in some embodiments, semiconductor plug 118 includes single-crystal silicon, the same material of substrate 102. In other words, semiconductor plug 118 can include an epitaxially-grown semiconductor layer that is the same as the material of substrate 102. Semiconductor plug 118 can function as a channel controlled by a source select gate of NAND memory string 110.

In some embodiments, lower channel structure 112 further includes a channel plug 126 in the upper portion (e.g., at the upper end) of lower channel structure 112. Channel plug 126 can be in contact with the upper end of semiconductor channel 122. Channel plug 126 can include semiconductor materials (e.g., polysilicon). In some embodiments, channel plug 126 includes an opening filled with Ti/TiN or Ta/TaN as an adhesion layer and tungsten as a conductor. By covering the upper end of lower channel structure 112 during the fabrication of 3D memory device 100, channel plug 126 can function as an etch stop layer to prevent etching of dielectrics filled in lower channel structure 112, such as silicon oxide and silicon nitride. Similarly, upper channel structure 114 can include a channel plug 132 as well at the upper end of NAND memory string 110. In some embodiments, channel plug 132 can function as the drain of NAND memory string 110.

As shown in FIG. 1A, lower channel structure 112 and upper channel structure 114 can be electrically connected to inter-deck plug 116 disposed therebetween. Inter-deck plug 116 can include silicon, such as amorphous silicon, polysilicon, or single-crystal silicon. In some embodiments, inter-deck plug 116 is disposed above and in contact with channel plug 126 of lower channel structure 112 to be electrically connected to lower channel structure 112. In some embodiments, inter-deck plug 116 is disposed below and in contact with semiconductor channel 130 of upper channel structure 114 to be electrically connected to upper channel structure 114. Multiple inter-deck plugs 116 of an array of NAND memory strings 110 can be surrounded and electrically isolated by inter-deck dielectric layer 138.

As shown in FIG. 1A, 3D memory device 100 further includes a slit structure 142 extending vertically through interleaved gate conductive layers 106 and gate-to-gate dielectric layers 108 of memory stack 104. Slit structure 142 can also extend laterally to separate memory stack 104 into multiple blocks. Slit structure 142 can include a slit opening that provides access for the chemical precursor to form gate conductive layers 106. In some embodiments, slit structure 142 includes a slit contact 146 having conductive materials including, but not limited to, W, Co, Cu, Al, polysilicon, silicides, or any combination thereof. To electrically isolate slit contact 146 from gate conductive layers 106, slit structure 142 can further include a spacer 144 disposed along the sidewall of the slit opening and in etch-back recesses 140 abutting the sidewall of the slit opening. Spacer 144 can include one or more layers of dielectric materials, such as silicon oxide, silicon nitride, silicon oxynitride, or any combination thereof. In some embodiments, slit contact 146 of slit structure 142 works as the source contact of 3D memory device 100 and electrically connects to the source of NAND memory string 110, e.g., an array common source (ACS) of the array of NAND memory strings 110.

Figure 1B:
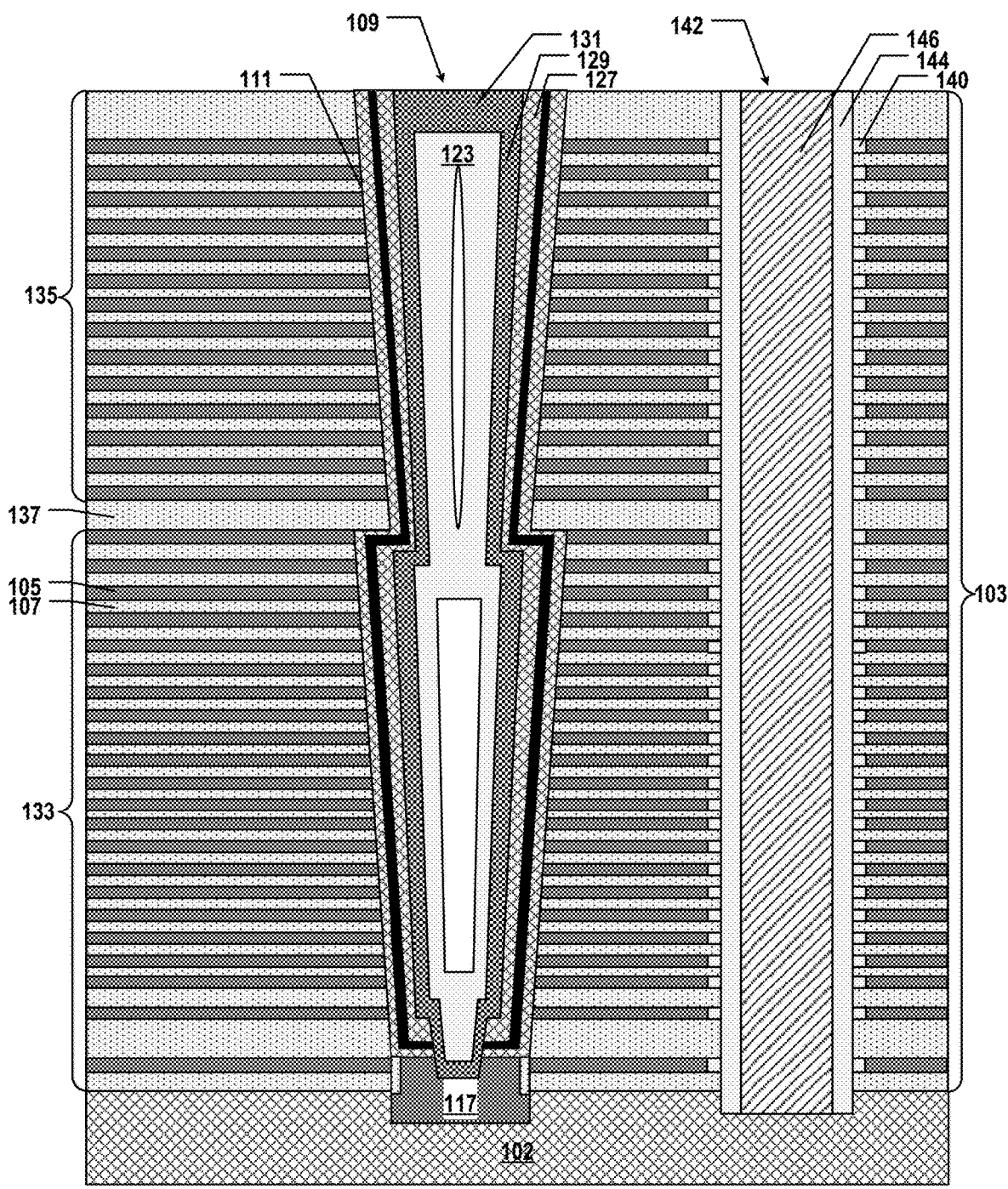
FIG. 1B illustrates a cross-section of another exemplary 3D memory device with a memory stack having silicon oxynitride gate-to-gate dielectric layers, according to some embodiments of the present disclosure.

In FIG. 1A, NAND memory string 110 includes two channel structures 112 and 114 electrically connected by inter-deck plug 116, which is also known as a dual-cell formation (DCF) structure. FIG. 1B illustrates a cross-section of another exemplary 3D memory device 101 with a memory stack 103 having silicon oxynitride gate-to-gate dielectric layers, according to some embodiments of the present disclosure. Different from FIG. 1A in which NAND memory string 110 has a DCF structure, 3D memory device 101 in FIG. 1B includes a NAND memory string 109 including a single channel structure 111, which is also known as a single-cell formation (SCF) structure. The remaining components of 3D memory device 101 are substantially similar to their counterparts in 3D memory device 100 in FIG. 1A and thus, may not be repeated in detail herein.

In some embodiments, 3D memory device 101 is a NAND Flash memory device in which memory cells are provided in the form of an array of NAND memory strings 109 each extending vertically above substrate 102. Memory stack 103 can include a plurality of interleaved gate conductive layers 105 and gate-to-gate dielectric layers 107. In some embodiments, each gate conductive layer 105 includes a metal layer, such as a tungsten layer. In some embodiments, each gate conductive layer 105 includes a doped polysilicon layer. Different from some known 3D memory devices having silicon oxide gate-to-gate-dielectric layers (e.g., each gate-to-gate dielectric layer includes a single silicon oxide layer), 3D memory device 101 can use non-silicon oxide gate-to-gate dielectric layers in memory stack 103 to avoid thermal budget difference-induced upper-to-lower deck oxide loss as well as improve barrier performance with reduced gate-to-gate coupling and leakage. In some embodiments, each gate-to-gate dielectric layer 107 includes a silicon oxynitride layer (referred to herein as a "silicon oxynitride gate-to-gate dielectric layer"). Each gate-to-gate dielectric layer 107 consists of a silicon oxynitride layer, i.e., is a single layer made of silicon oxynitride, according to some embodiments. In some embodiments, each gate-to-gate dielectric layer 107 includes a silicon oxynitride layer and at least one silicon oxide layer, such as a silicon oxynitride layer stacked between two silicon oxide layers.

In some embodiments, memory stack 103 has a multi-deck architecture (e.g., a dual-deck architecture as shown in FIG. 1B), which includes a lower memory deck 133 above substrate 102 and an upper memory deck 135 above lower memory deck 133. Each of lower and upper memory decks 133 and 135 can include interleaved gate conductive layers 105 and gate-to-gate dielectric layers 107 (each including a silicon oxynitride layer) as described above. Memory stack 103 can further include an inter-deck dielectric layer 137 between lower and upper memory decks 133 and 135. In some embodiments, inter-deck dielectric layer 137 includes the same materials as gate-to-gate dielectric layers 107, e.g., silicon oxynitride, and thus, is considered as part of lower memory deck 133 or upper memory deck 135.

As shown in FIG. 1B, NAND memory string 109 can include single channel structure 111 extending vertically through both lower memory deck 133 and upper memory deck 135. Channel structure 111 can include two channel holes (e.g., a lower channel hole and an upper channel hole) connected vertically and filled with a semiconductor layer (e.g., as a semiconductor channel 129) and multiple dielectric layers (e.g., as a memory film 127). In some embodiments, semiconductor channel 129 includes silicon, such as amorphous silicon, polysilicon, or single-crystal silicon. In some embodiments, memory film 127 is a composite layer including a tunneling layer, a storage layer (also known as a "charge trap layer"), and a blocking layer. The remaining space of channel structure 111 can be partially or fully filled with a capping layer 123 including dielectric materials, such as silicon oxide. Channel structure 111 can have a cylinder shape (e.g., a pillar shape). Capping layer 123, semiconductor channel 129, the tunneling layer, storage layer, and blocking layer of memory film 127 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof.

In some embodiments, NAND memory string 109 further includes a semiconductor plug 117 in the lower portion (e.g., at the lower end) of channel structure 111. Semiconductor plug 117 can include a semiconductor material, such as single-crystal silicon, which is epitaxially grown from substrate 102 in any suitable directions. Semiconductor plug 117 can function as a channel controlled by a source select gate of NAND memory string 109. In some embodiments, NAND memory string 109 further includes a channel plug 131 in the upper portion (e.g., at the upper end) of channel structure 111. In some embodiments, channel plug 131 can function as the drain of NAND memory string 109.

As shown in FIG. 1B, 3D memory device 101 further includes slit structure 142 extending vertically through interleaved gate conductive layers 105 and gate-to-gate dielectric layers 107 of memory stack 103. In some embodiments, slit structure 142 includes slit contact 146 working as the source contact of 3D memory device 101 and electrically connects to the source of NAND memory string 109, e.g., an ACS of the array of NAND memory strings 109. To electrically isolate slit contact 146 from gate conductive layers 105, slit structure 142 can further include spacer 144 disposed along the sidewall of the slit opening and in etch-back recesses 140 abutting the sidewall of the slit opening.

Figure 3A:
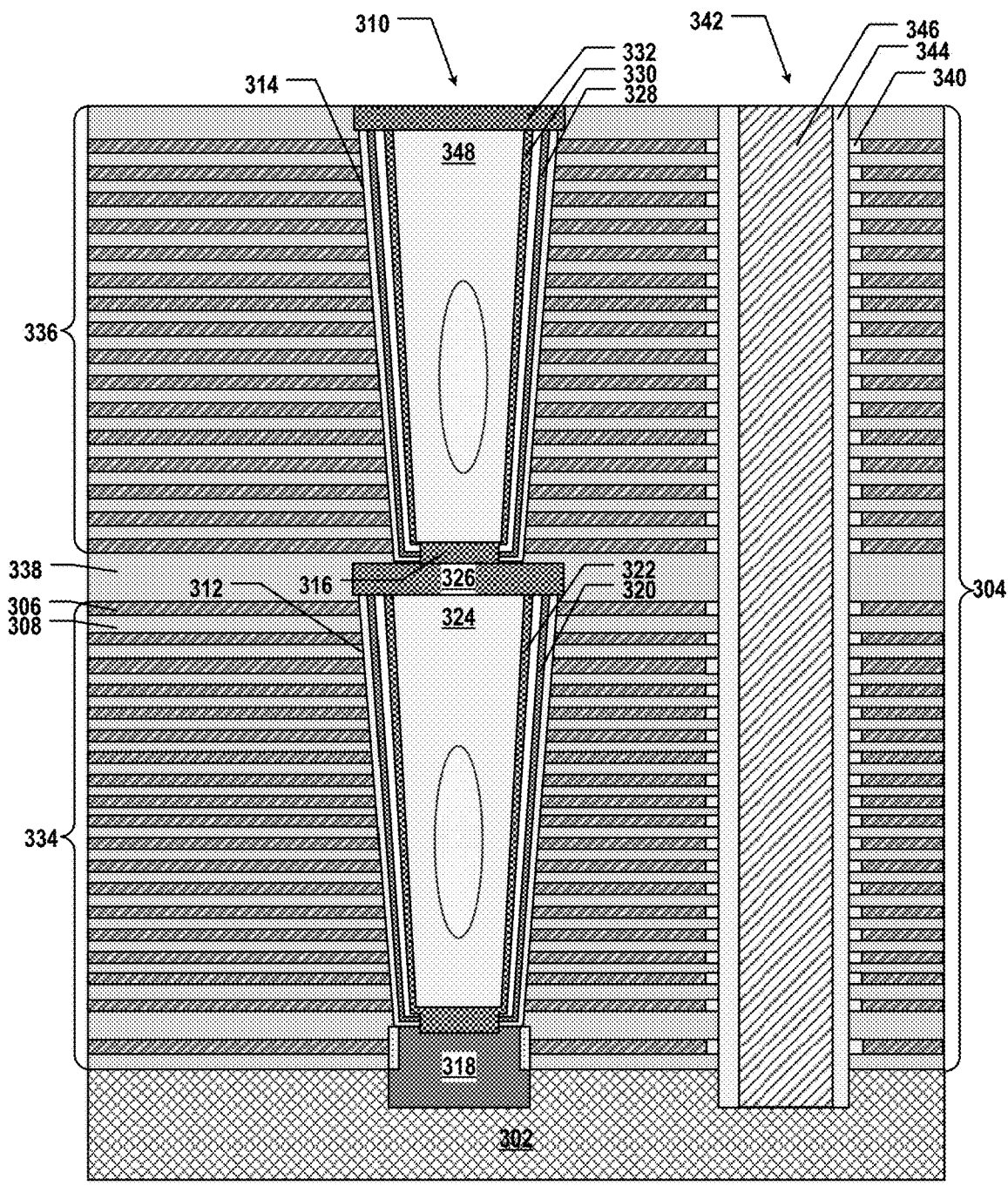
FIG. 3A illustrates a cross-section of an exemplary 3D memory device with a memory stack having silicon nitride gate-to-gate dielectric layers, according to some embodiments of the present disclosure.

It is understood that beside silicon oxynitride, other non-silicon oxide dielectric materials may be used for forming the gate-to-gate dielectric layers without oxide loss in the gate replacement process and having superior gate-to-gate barrier performance. For example, FIG. 3A illustrates a cross-section of an exemplary 3D memory device 300 with a memory stack 304 having silicon nitride gate-to-gate dielectric layers, according to some embodiments of the present disclosure. Different from 3D memory device 100 described above with respect to FIG. 1A in which silicon oxynitride gate-to-gate dielectric layers are used, 3D memory device 300 includes silicon nitride gate-to-gate dielectric layers in memory stack 304. The remaining components of 3D memory device 300 are substantially similar to their counterparts in 3D memory device 100 in FIG. 1A and thus, may not be repeated in detail herein.

In some embodiments, 3D memory device 300 is a NAND Flash memory device in which memory cells are provided in the form of an array of NAND memory strings 310 extending vertically above substrate 302. Memory stack 304 can include a plurality of interleaved gate conductive layers 306 and gate-to-gate dielectric layers 308. Each gate conductive layer 306 can include conductive materials including, but not limited to, W, Co, Cu, Al, polysilicon, doped silicon, silicides, or any combination thereof. In some embodiments, each gate conductive layer 306 includes a metal layer, such as a tungsten layer. In some embodiments, each gate conductive layer 306 includes a doped polysilicon layer. Polysilicon can be doped to a desired doping concentration with any suitable dopant to become a conductive material that can be used as the material of gate lines. The thickness of each gate conductive layer 306 can be between about 10 nm and about 50 nm, such as between 10 nm and 50 nm (e.g., 10 nm, 15 nm, 20 nm, 25 nm, 30 nm, 35 nm, 40 nm, 45 nm, 50 nm, any range bounded by the lower end by any of these values, or in any range defined by any two of these values). Each gate conductive layer 306 can be a gate electrode (gate line) surrounding NAND memory string 310 and can extend laterally as a word line.

Different from some known 3D memory devices having silicon oxide gate-to-gate-dielectric layers (e.g., each gate-to-gate dielectric layer includes a single silicon oxide layer), 3D memory device 300 can use non-silicon oxide gate-to-gate dielectric layers in memory stack 304 to avoid thermal budget difference-induced upper-to-lower deck oxide loss as well as improve barrier performance with reduced gate-to-gate coupling and leakage. In some embodiments, each gate-to-gate dielectric layer 308 includes a silicon nitride layer (referred to herein as a "silicon nitride gate-to-gate dielectric layer"). Silicon nitride ($Si_3N_4$) has a dielectric constant higher than that of silicon oxide, for example, between about 7 and about 11, such as between 7 and 11, at about 20° C. and thus, having better barrier performance than that of silicon oxide as the material of gate-to-gate dielectric layers 308. The thickness of gate-to-gate dielectric layer 308 can be between about 10 nm and about 50 nm, such as between 10 nm and 50 nm (e.g., 10 nm, 15 nm, 20 nm, 25 nm, 30 nm, 35 nm, 40 nm, 45 nm, 50 nm, any range bounded by the lower end by any of these values, or in any range defined by any two of these values). In some embodiments, each gate-to-gate dielectric layer 308 consists of a silicon nitride layer, i.e., is a single layer made of silicon nitride. Each gate-to-gate dielectric layer 308 does not include a silicon oxide layer, according to some embodiments. Each gate-to-gate dielectric layer 308 does not include a silicon oxynitride layer, according to some embodiments.

In some embodiments, memory stack 304 has a multi-deck architecture (e.g., a dual-deck architecture as shown in FIG. 3A), which includes a lower memory deck 334 above substrate 302 and an upper memory deck 336 above lower memory deck 334. Each of lower and upper memory decks 334 and 336 can include interleaved gate conductive layers 306 and gate-to-gate dielectric layers 308 (each including a silicon nitride layer) as described above. Memory stack 304 can further include an inter-deck dielectric layer 338 between lower and upper memory decks 334 and 336. In some embodiments, inter-deck dielectric layer 338 includes the same materials as gate-to-gate dielectric layers 308, e.g., silicon nitride, and thus, is considered as part of lower memory deck 334 or upper memory deck 336.

As shown in FIG. 3A, NAND memory string 310 has a DCF structure that includes a lower channel structure 312 extending vertically through lower memory deck 334, an upper channel structure 314 extending vertically through upper memory deck 336, and an inter-deck plug 316 vertically between and in contact with lower channel structure 312 and upper channel structure 314, respectively. Lower channel structure 312 can include a channel hole filled with a semiconductor layer (e.g., as a semiconductor channel 322) and multiple dielectric layers (e.g., as a memory film 320). In some embodiments, semiconductor channel 322 includes silicon, such as amorphous silicon, polysilicon, or single-crystal silicon. In some embodiments, memory film 320 is a composite layer including a tunneling layer, a storage layer (also known as a "charge trap layer"), and a blocking layer. The remaining space of lower channel structure 312 can be partially or fully filled with a capping layer 324 including dielectric materials, such as silicon oxide. Similarly, upper channel structure 314 can include a memory film 328, a semiconductor channel 330, and a capping layer 348 arranged radially from the center toward the outer surface of the pillar in this order.

In some embodiments, lower channel structure 312 further includes a semiconductor plug 318 in the lower portion (e.g., at the lower end) of lower channel structure 312. Semiconductor plug 318 can include a semiconductor material, such as single-crystal silicon, which is epitaxially grown from substrate 302 in any suitable directions. Semiconductor plug 318 can function as a channel controlled by a source select gate of NAND memory string 310. In some embodiments, lower channel structure 312 further includes a channel plug 326 in an upper portion (e.g., at the upper end) of lower channel structure 312. Similarly, upper channel structure 314 can include a channel plug 332 as well at the upper end of NAND memory string 310. In some embodiments, channel plug 332 can function as the drain of NAND memory string 310. As shown in FIG. 3A, lower channel structure 312 and upper channel structure 314 can be electrically connected to an inter-deck plug 316 disposed therebetween. Inter-deck plug 316 can include silicon, such as amorphous silicon, polysilicon, or single crystalline silicon. Multiple inter-deck plugs 316 of array of NAND memory strings 310 can be surrounded and electrically isolated by inter-deck dielectric layer 338.

As shown in FIG. 3A, 3D memory device 300 further includes a slit structure 342 extending vertically through interleaved gate conductive layers 306 and gate-to-gate dielectric layers 308 of memory stack 304. In some embodiments, slit structure 342 includes a slit contact 346 working as the source contact of 3D memory device 300 and electrically connects to the source of NAND memory string 310, e.g., an ACS of the array of NAND memory strings 310. To electrically isolate slit contact 346 from gate conductive layers 306, slit structure 342 can further include a spacer 344 disposed along the sidewall of the slit opening and in etch-back recesses 340 abutting the sidewall of the slit opening.

Figure 3B:
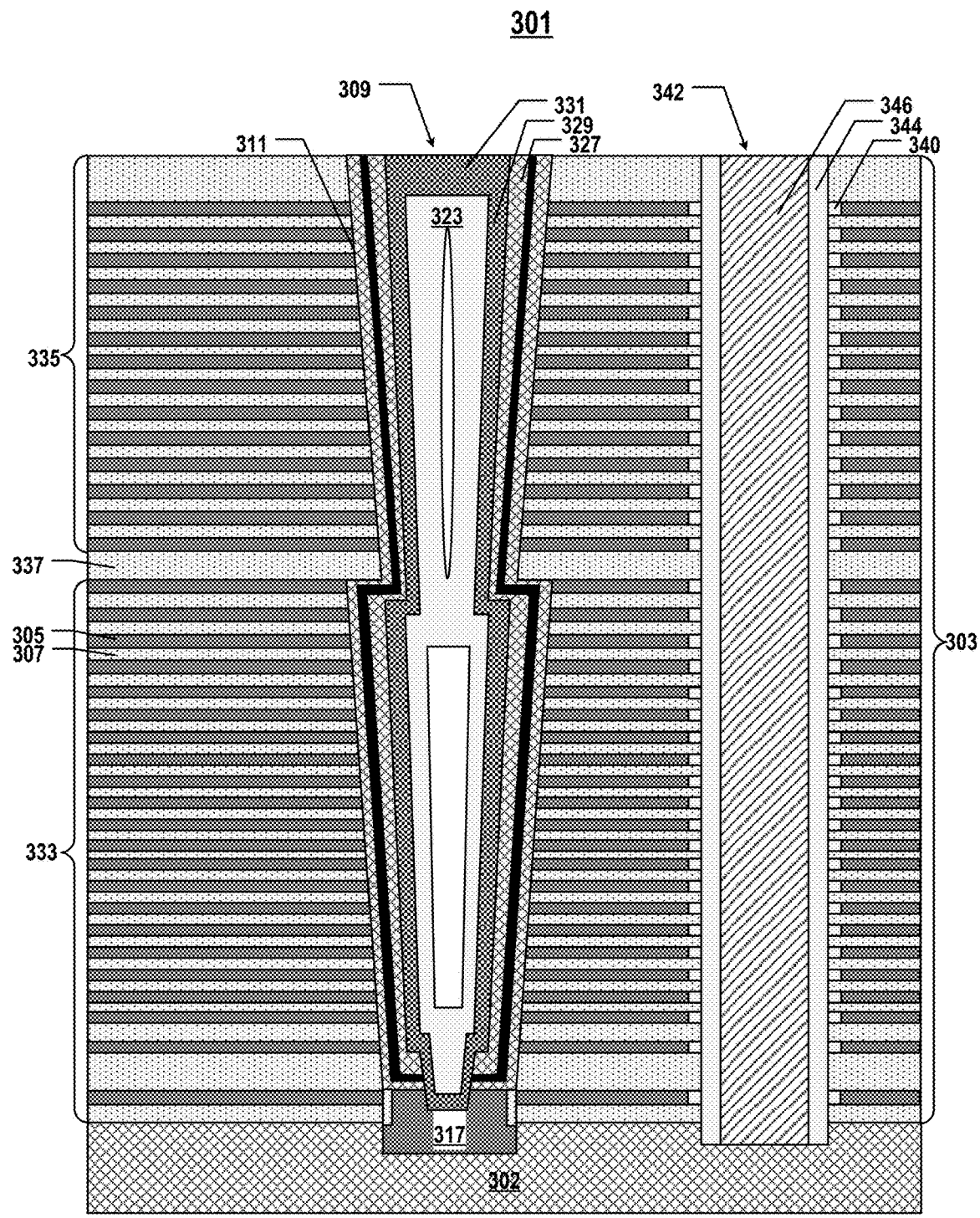
FIG. 3B illustrates a cross-section of another exemplary 3D memory device with a memory stack having silicon nitride gate-to-gate dielectric layers, according to some embodiments of the present disclosure.

FIG. 3B illustrates a cross-section of another exemplary 3D memory device 301 with a memory stack 303 having silicon nitride gate-to-gate dielectric layers, according to some embodiments of the present disclosure. Different from FIG. 3A in which NAND memory string 310 has a DCF structure, 3D memory device 301 in FIG. 3B includes a NAND memory string 309 including a single channel structure 311, which is also known as a SCF structure. The remaining components of 3D memory device 301 are substantially similar to their counterparts in 3D memory device 300 in FIG. 3A and thus, may not be repeated in detail herein.

In some embodiments, 3D memory device 301 is a NAND Flash memory device in which memory cells are provided in the form of an array of NAND memory strings 309 each extending vertically above substrate 302. Memory stack 303 can include a plurality of interleaved gate conductive layers 305 and gate-to-gate dielectric layers 307. In some embodiments, each gate conductive layer 305 includes a metal layer, such as a tungsten layer. In some embodiments, each gate conductive layer 305 includes a doped polysilicon layer. Different from some known 3D memory devices having silicon oxide gate-to-gate-dielectric layers (e.g., each gate-to-gate dielectric layer includes a single silicon oxide layer), 3D memory device 301 can use non-silicon oxide gate-to-gate dielectric layers in memory stack 303 to avoid thermal budget difference-induced upper-to-lower deck oxide loss as well as improve barrier performance with reduced gate-to-gate coupling and leakage. In some embodiments, each gate-to-gate dielectric layer 307 includes a silicon nitride layer (referred to herein as a "silicon nitride gate-to-gate dielectric layer"). Each gate-to-gate dielectric layer 307 consists of a silicon oxynitride nitride layer, i.e., is a single layer made of silicon nitride, according to some embodiments. In some embodiments, each gate-to-gate dielectric layer 307 does not include a silicon oxide layer. In some embodiments, each gate-to-gate dielectric layer 307 does not include a silicon oxynitride layer.

In some embodiments, memory stack 303 has a multi-deck architecture (e.g., a dual-deck architecture as shown in FIG. 3B), which includes a lower memory deck 333 above substrate 302 and an upper memory deck 335 above lower memory deck 333. Each of lower and upper memory decks 333 and 335 can include interleaved gate conductive layers 305 and gate-to-gate dielectric layers 307 (each including a silicon nitride layer) as described above. Memory stack 303 can further include an inter-deck dielectric layer 337 between lower and upper memory decks 333 and 335. In some embodiments, inter-deck dielectric layer 337 includes the same materials as gate-to-gate dielectric layers 307, e.g., silicon nitride, and thus, is considered as part of lower memory deck 333 or upper memory deck 335.

As shown in FIG. 3B, NAND memory string 309 can include single channel structure 311 extending vertically through both lower memory deck 333 and upper memory deck 335. Channel structure 311 can include two channel holes (e.g., a lower channel hole and an upper channel hole) connected vertically and filled with a semiconductor layer (e.g., as a semiconductor channel 329) and multiple dielectric layers (e.g., as a memory film 327). In some embodiments, semiconductor channel 329 includes silicon, such as amorphous silicon, polysilicon, or single-crystal silicon. In some embodiments, memory film 327 is a composite layer including a tunneling layer, a storage layer (also known as a "charge trap layer"), and a blocking layer. The remaining space of channel structure 311 can be partially or fully filled with a capping layer 323 including dielectric materials, such as silicon oxide.

In some embodiments, NAND memory string 309 further includes a semiconductor plug 317 in the lower portion (e.g., at the lower end) of channel structure 311. Semiconductor plug 317 can include a semiconductor material, such as single-crystal silicon, which is epitaxially grown from substrate 302 in any suitable directions. Semiconductor plug 317 can function as a channel controlled by a source select gate of NAND memory string 309. In some embodiments, NAND memory string 309 further includes a channel plug 331 in the upper portion (e.g., at the upper end) of channel structure 311. In some embodiments, channel plug 331 can function as the drain of NAND memory string 309.

As shown in FIG. 3B, 3D memory device 301 further includes slit structure 342 extending vertically through interleaved gate conductive layers 305 and gate-to-gate dielectric layers 307 of memory stack 303. In some embodiments, slit structure 342 includes slit contact 346 working as the source contact of 3D memory device 301 and electrically connects to the source of NAND memory string 309, e.g., an ACS of the array of NAND memory strings 309. To electrically isolate slit contact 346 from gate conductive layers 305, slit structure 342 can further include spacer 344 disposed along the sidewall of the slit opening and in etch-back recesses 340 abutting the sidewall of the slit opening.

Figure 4A:
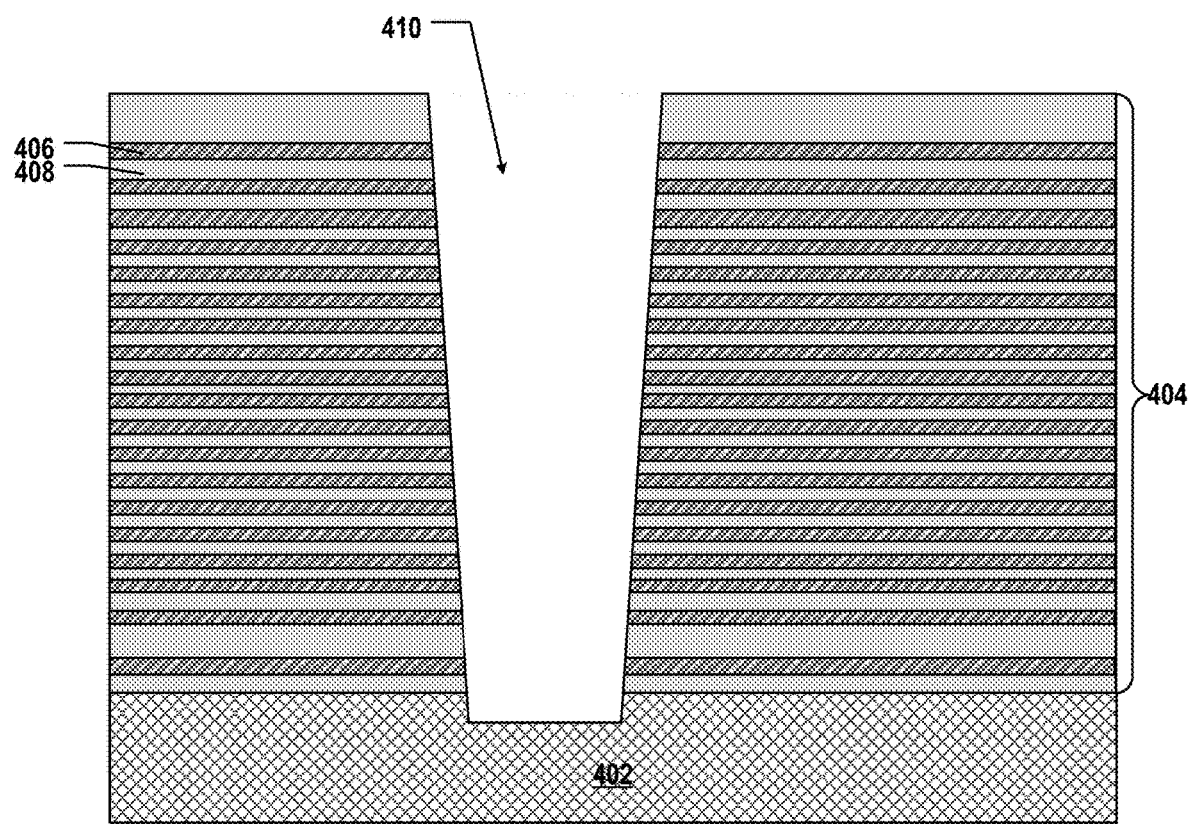
FIGS. 4A-4C illustrate an exemplary fabrication process for forming a NAND memory string, according to some embodiments of the present disclosure.
Figure 4B:
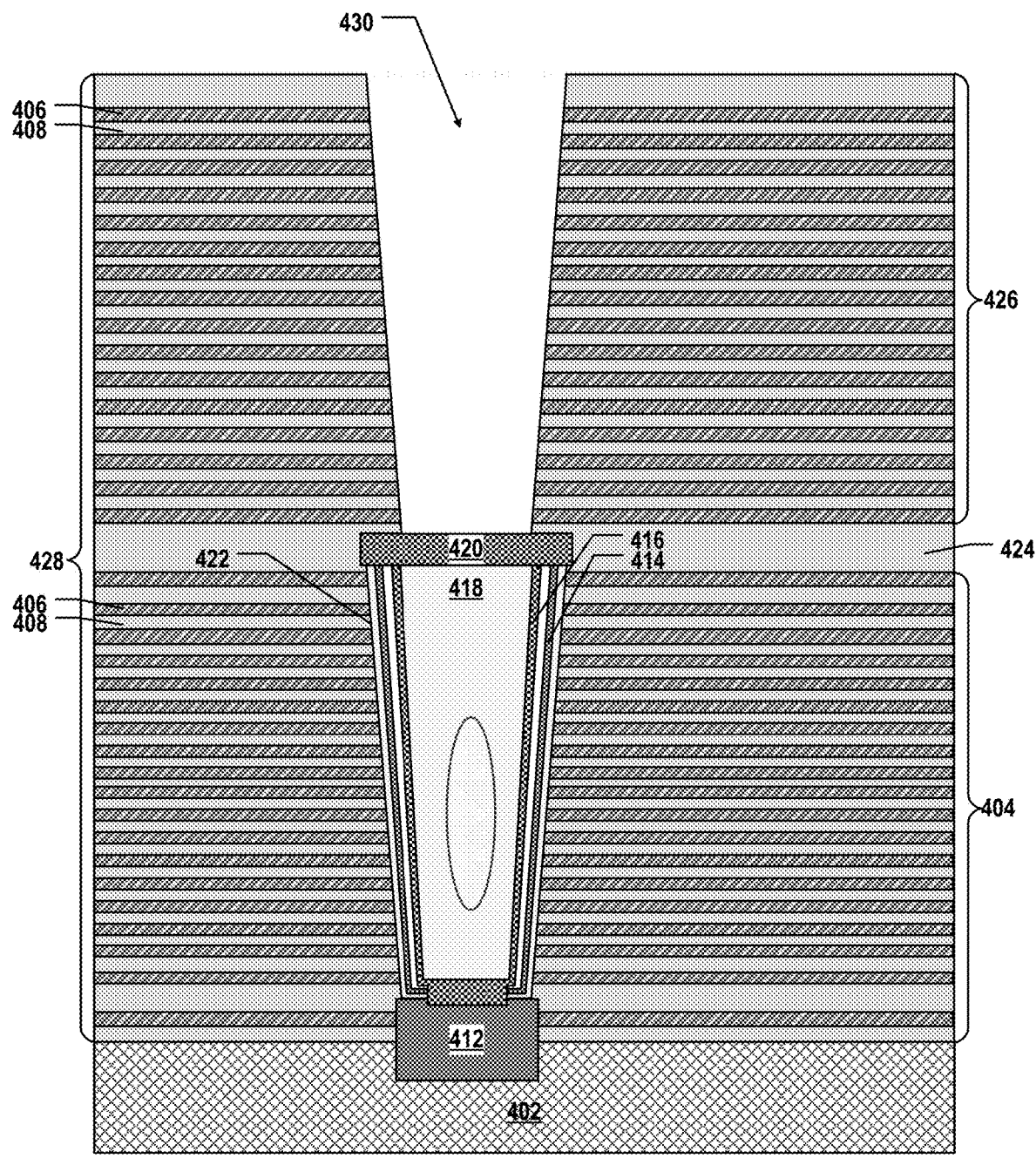
Figure 4C:
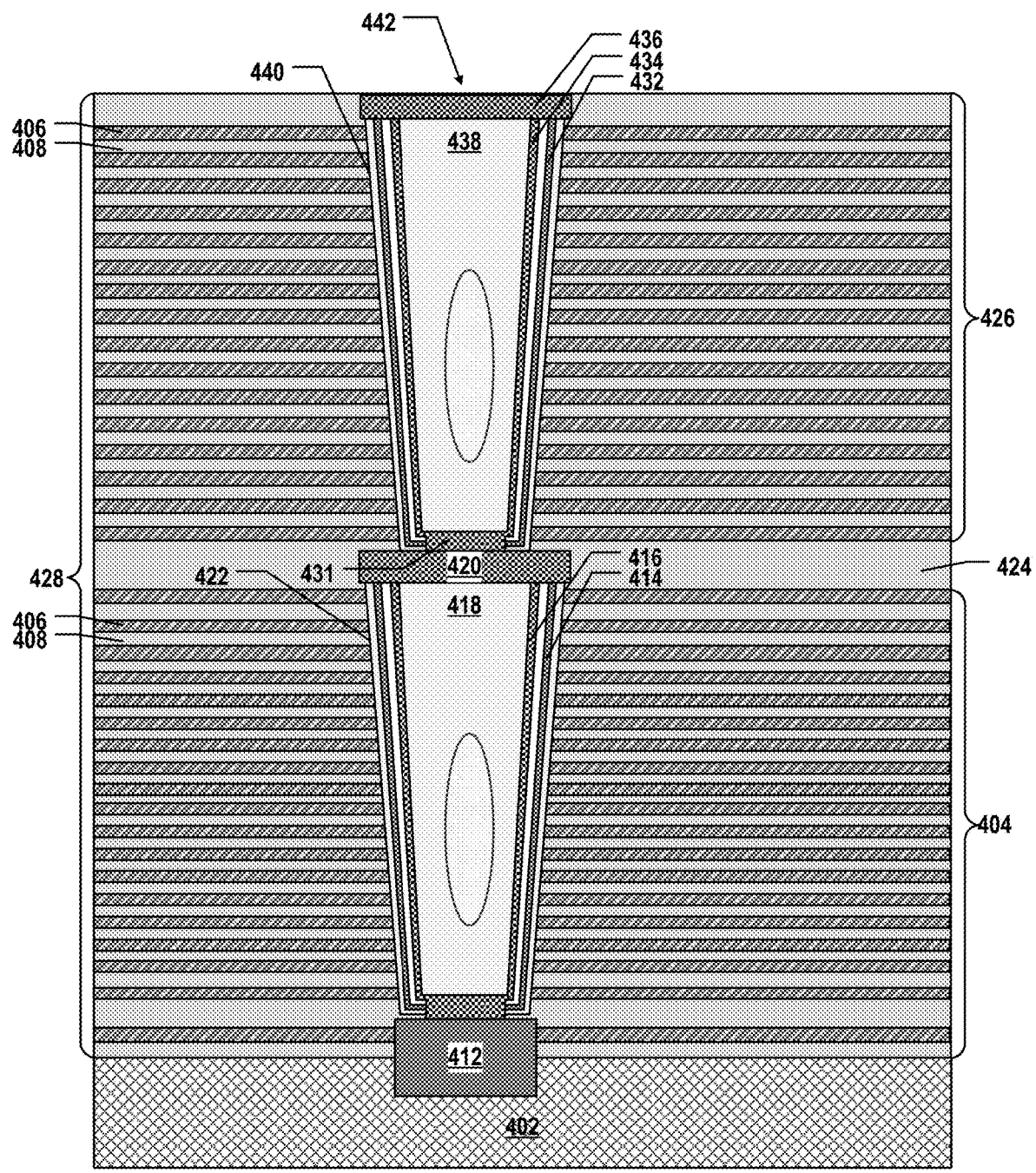
Figure 7A:
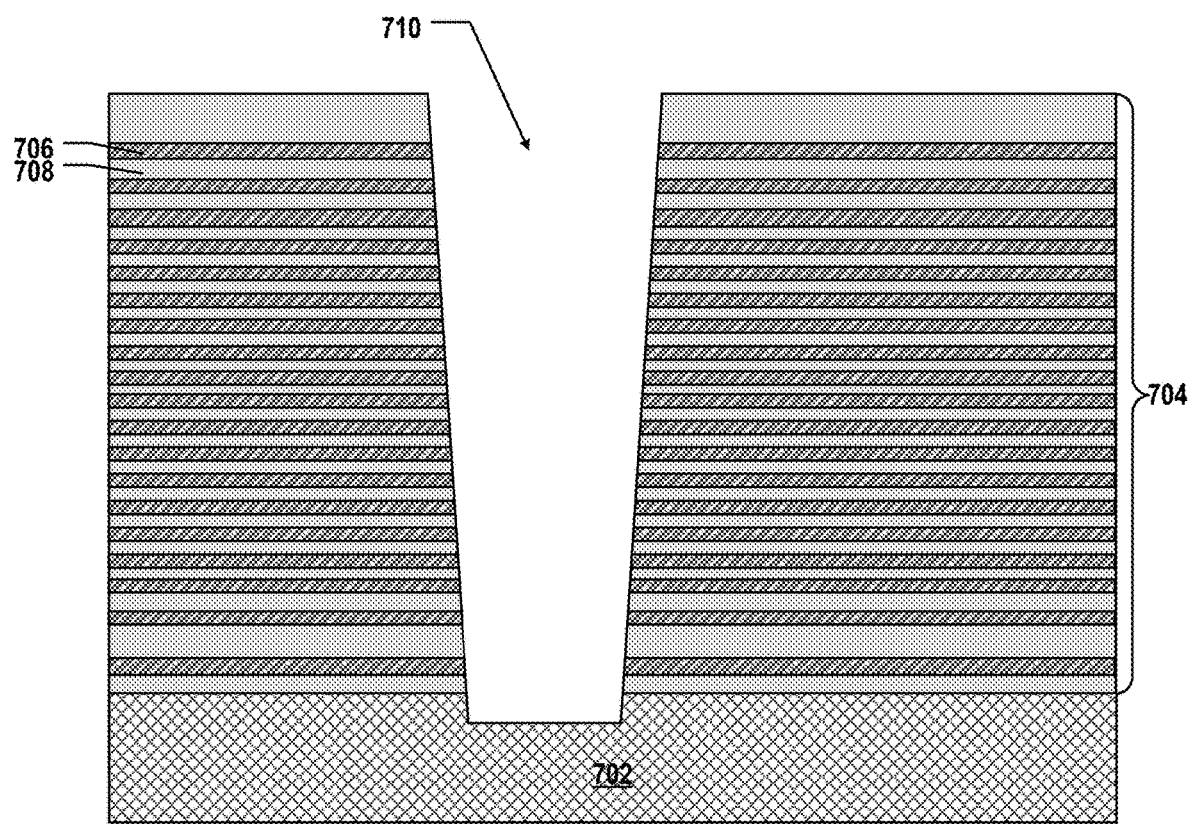
FIGS. 7A-7C illustrate an exemplary fabrication process for forming another NAND memory string, according to some embodiments of the present disclosure.
Figure 7A:
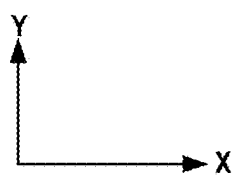
Figure 7B:
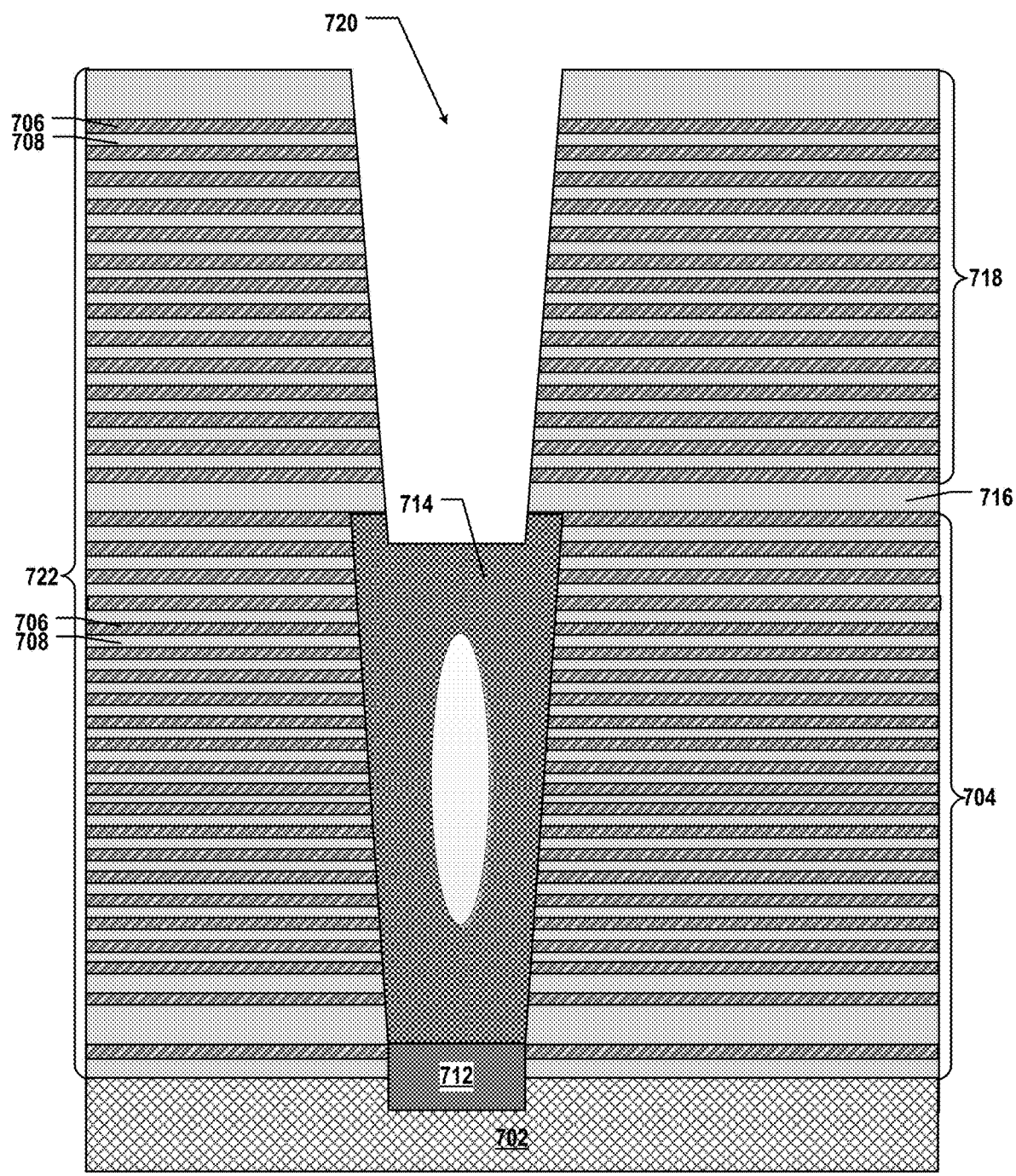
Figure 7C:
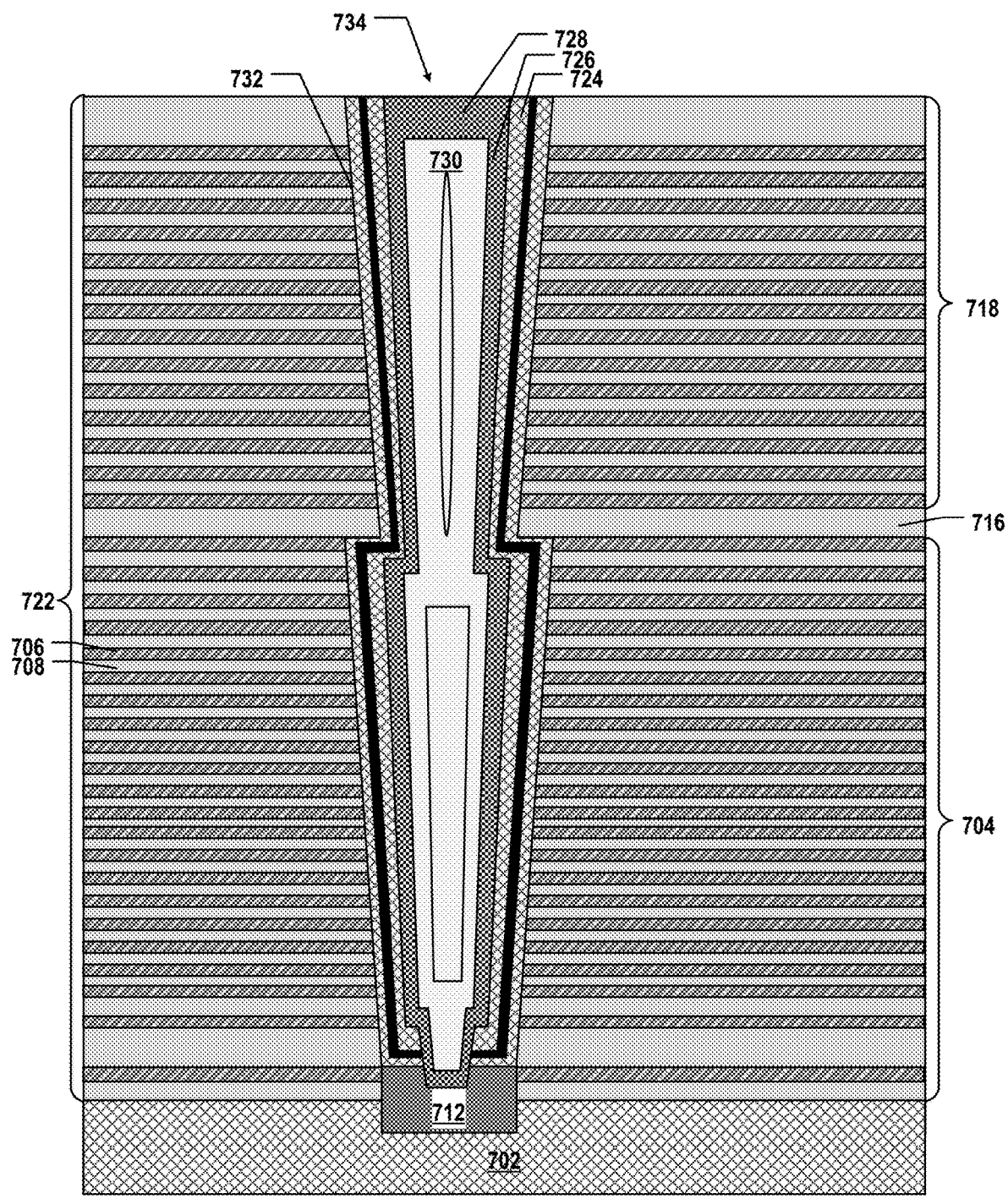
Figure 10:
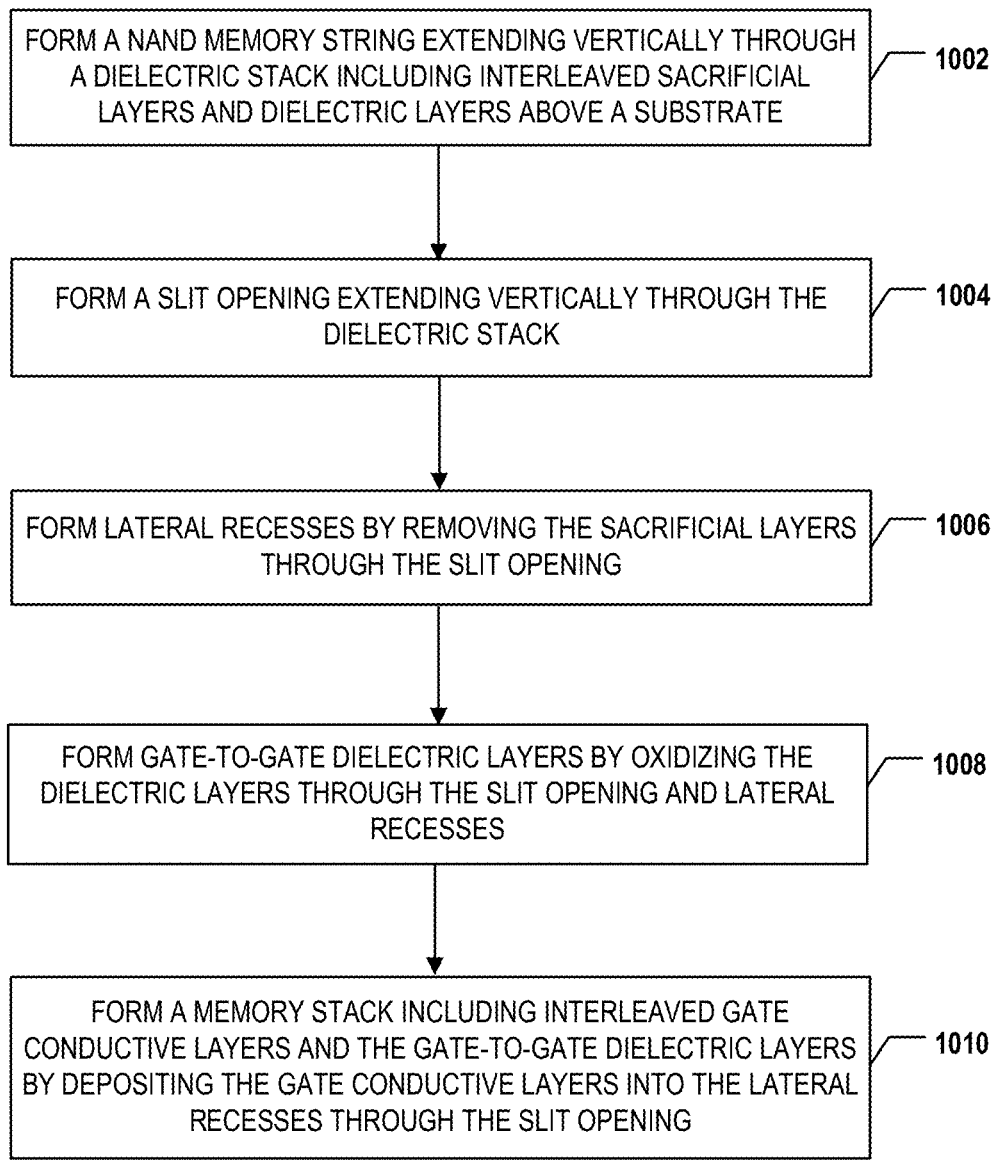
FIG. 10 illustrates a flowchart of an exemplary method for forming a 3D memory device with a memory stack having silicon oxynitride gate-to-gate dielectric layers, according to some embodiments of the present disclosure.

FIGS. 4A-4C illustrate an exemplary fabrication process for forming a NAND memory string, according to some embodiments of the present disclosure. FIGS. 5A-5D illustrate an exemplary fabrication process for forming a 3D memory device with a memory stack having silicon oxynitride gate-to-gate dielectric layers, according to some embodiments of the present disclosure. FIGS. 7A-7C illustrate an exemplary fabrication process for forming another NAND memory string, according to some embodiments of the present disclosure. FIGS. 8A-8D illustrate an exemplary fabrication process for forming another 3D memory device with a memory stack having silicon oxynitride gate-to-gate dielectric layers, according to some embodiments of the present disclosure. FIG. 10 illustrates a flowchart of an exemplary method 1000 for forming a 3D memory device with a memory stack having silicon oxynitride gate-to-gate dielectric layers, according to some embodiments of the present disclosure. Examples of the 3D memory device depicted in FIGS. 4A-4C, 5A-5D, 7A-7C, and 8A-8D include 3D memory devices 100 and 101 depicted in FIGS. 1A and 1B. FIGS. 4A-4C, 5A-5D, 7A-7C, 8A-8D, and 10 will be described together. It is understood that the operations shown in method 1000 are not exhaustive and that other operations can be performed as well before, after, or between any of the illustrated operations. Further, some of the operations may be performed simultaneously, or in a different order than shown in FIG. 10.

Referring to FIG. 10, method 1000 starts at operation 1002, in which a NAND memory string extending vertically through a dielectric stack including a plurality of interleaved sacrificial layers and dielectric layers above a substrate is formed. The substrate can be a silicon substrate. In some embodiments, each of the sacrificial layers includes a polysilicon layer, and each of the dielectric layers includes a silicon nitride layer. In some embodiments, to form the NAND memory string, a first dielectric deck is formed, and a first channel structure extending vertically through the first dielectric deck is formed. In some embodiments, to form the NAND memory string, an inter-deck plug is formed above and in contact with the first channel structure. In some embodiments, to form the NAND memory string, a second dielectric deck is formed above the first dielectric deck, and a second channel structure extending vertically through the second dielectric deck is formed above and in contact with the inter-deck plug.

Referring to FIG. 4A, a lower dielectric deck 404 including a plurality pairs of a sacrificial layer 406 and a dielectric layer 408 is formed above a silicon substrate 402. Lower dielectric deck 404 includes interleaved sacrificial layers 406 and dielectric layers 408, according to some embodiments. Dielectric layers 408 and sacrificial layers 406 can be alternatingly deposited on silicon substrate 402 to form lower dielectric deck 404. In some embodiments, each dielectric layer 408 includes a layer of silicon nitride, and each sacrificial layer 406 includes a layer of polysilicon. That is, a plurality of polysilicon layers and a plurality of silicon nitride layers can be alternatingly deposited above silicon substrate 402 to form lower dielectric deck 404. Polysilicon and silicon nitride are a pair of materials having high etching selectivity, for example, greater than 30, according to some embodiments. It is understood that other pairs of materials having high etching selectivity may be used the materials of dielectric layers 408 and sacrificial layers 406 in other embodiments. Lower dielectric deck 404 can be formed by one or more thin film deposition processes including, but not limited to, chemical vapor deposition (CVD), physical vapor deposition (PVD), atomic layer deposition (ALD), or any combination thereof.

As illustrated in FIG. 4A, a lower channel hole 410 is an opening formed extending vertically through lower dielectric deck 404. In some embodiments, a plurality of openings are formed through lower dielectric deck 404 such that each opening becomes the location for growing an individual NAND memory string in the later process. In some embodiments, fabrication processes for forming lower channel hole 410 include wet etching and/or dry etching, such as deep-ion reactive etching (DRIE). In some embodiments, lower channel hole 410 extends further through the top portion of silicon substrate 402. The etching process through lower dielectric deck 404 may not stop at the top surface of silicon substrate 402 and may continue to etch part of silicon substrate 402.

As illustrated in FIG. 4B, a semiconductor plug 412 can be formed by filling the lower portion of lower channel hole 410 (as shown in FIG. 4A) with single-crystal silicon epitaxially grown from silicon substrate 402 in any suitable directions (e.g., from bottom surface and/or side surface). The fabrication processes for epitaxially growing semiconductor plug 412 can include, but not limited to, vapor-phase epitaxy (VPE), liquid-phase epitaxy (LPE), molecular-beam epitaxy (MPE), or any combinations thereof.

As illustrated in FIG. 4B, a memory film 414 (including a blocking layer, a storage layer, and a tunneling layer) and a semiconductor channel 416 are formed along the sidewall of lower channel hole 410 and above semiconductor plug 412. In some embodiments, memory film 414 is first deposited along the sidewall of lower channel hole 410 and above semiconductor plug 412, and semiconductor channel 416 is then deposited over memory film 414. The blocking layer, storage layer, and tunneling layer can be subsequently deposited in this order using one or more thin film deposition processes, such as ALD, CVD, PVD, any other suitable processes, or any combination thereof, to form memory film 414. Semiconductor channel 416 can then be formed by depositing polysilicon on the tunneling layer using one or more thin film deposition processes, such as ALD, CVD, PVD, any other suitable processes, or any combination thereof. Semiconductor channel 416 can be in contact with semiconductor plug 412 using, for example, a SONO punch process. In some embodiments, semiconductor channel 416 is deposited in lower channel hole 410 without completely filling lower channel hole 410. As illustrated in FIG. 4B, a capping layer 418, such as a silicon oxide layer, is formed in lower channel hole 410 to fully or partially fill the remaining space of lower channel hole 410 using one or more thin film deposition processes, such as CVD, PVD, ALD, electroplating, electroless plating, or any combination thereof.

As illustrated in FIG. 4B, a channel plug 420 is formed in the upper portion of lower channel hole 410 (shown in FIG. 4A). In some embodiments, parts of memory film 414, semiconductor channel 416, and capping layer 418 that are on the top surface of lower dielectric deck 404 are removed and planarized by CMP, wet etching and/or dry etching. A recess then can be formed in the upper portion of lower channel hole 410 by wet etching and/or drying etching parts of memory film 414, semiconductor channel 416, and capping layer 418 in the upper portion of lower channel hole 410. Channel plug 420 then can be formed by depositing semiconductor materials, such as polysilicon, into the recess by one or more thin film deposition processes, such as CVD, PVD, ALD, electroplating, electroless plating, or any combination thereof. A lower channel structure 422 is thereby formed through lower dielectric deck 404.

As illustrated in FIG. 4B, an upper dielectric deck 426 including a plurality pairs of sacrificial layer 406 and dielectric layer 408 is formed above lower dielectric deck 404. Upper dielectric deck 426 can be formed by one or more thin film deposition processes including, but not limited to, CVD, PVD, ALD, or any combination thereof. In some embodiments, an inter-deck dielectric layer 424, such as a layer of silicon nitride, is deposited on lower dielectric deck 404 prior to the formation of upper dielectric deck 426, such that upper dielectric deck 426 is deposited on inter-deck dielectric layer 424. Similar to lower dielectric deck 404, a plurality of polysilicon layers and a plurality of silicon nitride layers can be alternatingly deposited above lower dielectric deck 404 to form upper dielectric deck 426. A dielectric stack 428 including lower and upper dielectric decks 404 and 426 is thereby formed. As illustrated in FIG. 4B, an upper channel hole 430 is another opening formed extending vertically through upper dielectric deck 426 to expose channel plug 420 of lower channel structure 422. Upper channel hole 430 can be aligned with lower channel structure 422 so as to expose at least part of channel plug 420. In some embodiments, fabrication processes for forming upper channel hole 430 include wet etching and/or dry etching, such as DRIE.

As illustrated in FIG. 4C, an inter-deck plug 431 can be formed above and in contact with channel plug 420 of lower channel structure 422. In some embodiments, inter-deck plug 431 is formed by patterning inter-deck dielectric layer 424 and depositing semiconductor materials, such as polysilicon, on channel plug 420 by one or more thin film deposition processes including, but not limited to, CVD, PVD, ALD, or any combination thereof. As illustrated in FIG. 4C, a memory film 432 (including a blocking layer, a storage layer, and a tunneling layer) and a semiconductor channel 434 are formed along the sidewall of upper channel hole 430 (as shown in FIG. 4B) and above inter-deck plug 431. In some embodiments, memory film 432 is first deposited along the sidewall of upper channel hole 430 and above inter-deck plug 431, and semiconductor channel 434 is then deposited over memory film 432 using one or more thin film deposition processes, such as ALD, CVD, PVD, any other suitable processes, or any combination thereof. As illustrated in FIG. 4C, a capping layer 438, such as a silicon oxide layer, is formed in upper channel hole 430 to fully or partially fill the remaining space of upper channel hole 430 using one or more thin film deposition processes, such as CVD, PVD, ALD, electroplating, electroless plating, or any combination thereof. As illustrated in FIG. 4C, a channel plug 436 is formed in the upper portion of upper channel hole 430 (shown in FIG. 4B) by depositing semiconductor materials, such as polysilicon, into a recess by one or more thin film deposition processes, such as CVD, PVD, ALD, electroplating, electroless plating, or any combination thereof. An upper channel structure 440 is thereby formed through upper dielectric deck 426. A NAND memory string 442 including lower and upper channel structures 422 and 440 is thereby formed through dielectric stack 428.

FIGS. 4A-4C illustrate an exemplary fabrication process for forming NAND memory string 442 having a DCF structure. A different NAND memory string having a SCF structure can be formed as shown in FIGS. 7A-7C. In some embodiments, to form the NAND memory string, a first dielectric deck is formed, a second dielectric deck is formed above the first dielectric deck, and a single channel structure extending vertically through the first and second dielectric decks is formed.

Referring to FIG. 7A, a lower dielectric deck 704 including a plurality pairs of a sacrificial layer 706 and a dielectric layer 708 is formed above a silicon substrate 702. Lower dielectric deck 704 includes interleaved sacrificial layers 706 and dielectric layers 708, according to some embodiments. In some embodiments, each dielectric layer 708 includes a layer of silicon nitride, and each sacrificial layer 706 includes a layer of polysilicon. That is, a plurality of polysilicon layers and a plurality of silicon nitride layers can be alternatingly deposited above silicon substrate 702 to form lower dielectric deck 704 using one or more thin film deposition processes including, but not limited to, CVD, PVD, ALD, or any combination thereof. Polysilicon and silicon nitride are a pair of materials having high etching selectivity, for example, greater than 30, according to some embodiments. It is understood that other pairs of materials having high etching selectivity may be used the materials of dielectric layers 708 and sacrificial layers 706 in other embodiments. As illustrated in FIG. 7A, a lower channel hole 710 is an opening formed extending vertically through lower dielectric deck 704. In some embodiments, fabrication processes for forming lower channel hole 710 include wet etching and/or dry etching, such as DRIE. The etching process through lower dielectric deck 704 may not stop at the top surface of silicon substrate 702 and may continue to etch part of silicon substrate 702.

As illustrated in FIG. 7B, a semiconductor plug 712 can be formed by filling the lower portion of lower channel hole 710 (as shown in FIG. 7A) with single-crystal silicon epitaxially grown from silicon substrate 702 in any suitable directions (e.g., from bottom surface and/or side surface) using VPE, LPE, MPE, or any combinations thereof. As illustrated in FIG. 7B, a sacrificial layer 714 is deposited using one or more thin film deposition processes, such as PVD, CVD, ALD, electroplating, electroless plating, or any combinations thereof, to partially or fully fill lower channel hole 710 (shown in FIG. 7A). Sacrificial layer 714 can include any suitable material that is to be removed in a later process. To avoid removing sacrificial layer 706 and/or dielectric layer 708 together with sacrificial layer 714, sacrificial layer 714 and sacrificial layer 706 and/or dielectric layer 708 include different materials, according to some embodiments.

As illustrated in FIG. 7B, an upper dielectric deck 718 including a plurality pairs of sacrificial layer 706 and dielectric layer 708 is formed above lower upper dielectric deck 704. Upper dielectric deck 718 can be formed by one or more thin film deposition processes including, but not limited to, CVD, PVD, ALD, or any combination thereof. In some embodiments, an inter-deck dielectric layer 716, such as a layer of silicon nitride, is deposited on lower dielectric deck 704 prior to the formation of upper dielectric deck 718, such that upper dielectric deck 718 is deposited on inter-deck dielectric layer 716. Similar to lower dielectric deck 704, a plurality of polysilicon layers and a plurality of silicon nitride layers can be alternatingly deposited above lower dielectric deck 704 to form upper dielectric deck 718. A dielectric stack 722 including lower and upper dielectric decks 704 and 718 is thereby formed. As illustrated in FIG. 7B, an upper channel hole 720 is another opening formed extending vertically through upper dielectric deck 718 to expose sacrificial layer 714. Upper channel hole 720 can be aligned with sacrificial layer 714 so as to expose at least part of sacrificial layer 714. In some embodiments, fabrication processes for forming upper channel hole 720 include wet etching and/or dry etching, such as DRIE.

As illustrated in FIG. 7C, sacrificial layer 714 (shown in FIG. 7B) is removed in lower dielectric deck 704 by wet etching and/or dry etching. After the removal of sacrificial layer 714, lower channel hole 710 (as shown in FIG. 7A) becomes open again and connected with upper channel hole 720. As illustrated in FIG. 7C, a memory film 724 (including a blocking layer, a storage layer, and a tunneling layer) and a semiconductor channel 726 are formed along the sidewall of lower and upper channel holes 710 and 720 and above semiconductor plug 712. In some embodiments, memory film 724 is first deposited along the sidewall of lower and upper channel holes 710 and 720 and above semiconductor plug 712, and semiconductor channel 726 is then deposited over memory film 724. The blocking layer, storage layer, and tunneling layer can be subsequently deposited in this order using one or more thin film deposition processes, such as ALD, CVD, PVD, any other suitable processes, or any combination thereof, to form memory film 724. Semiconductor channel 726 can then be formed by depositing polysilicon on the tunneling layer using one or more thin film deposition processes, such as ALD, CVD, PVD, any other suitable processes, or any combination thereof. Semiconductor channel 726 can be in contact with semiconductor plug 712 using, for example, a SONO punch process. In some embodiments, semiconductor channel 726 is deposited in lower and upper channel holes 710 and 720 without completely filling lower and upper channel holes 710 and 720. As illustrated in FIG. 7C, a capping layer 730, such as a silicon oxide layer, is formed in lower and upper channel holes 710 and 720 to fully or partially fill the remaining space of lower and upper channel holes 710 and 720 using one or more thin film deposition processes, such as CVD, PVD, ALD, electroplating, electroless plating, or any combination thereof. As illustrated in FIG. 7C, a channel plug 728 is formed in the upper portion of upper channel hole 720 (shown in FIG. 7B). Channel plug 728 can be formed by depositing semiconductor materials, such as polysilicon, into a recess by one or more thin film deposition processes, such as CVD, PVD, ALD, electroplating, electroless plating, or any combination thereof. A single channel structure 732 is thereby formed through lower and upper dielectric decks 704 and 718. A NAND memory string 734 including single channel structure 732 is thereby formed through dielectric stack 722.

Figure 5A:
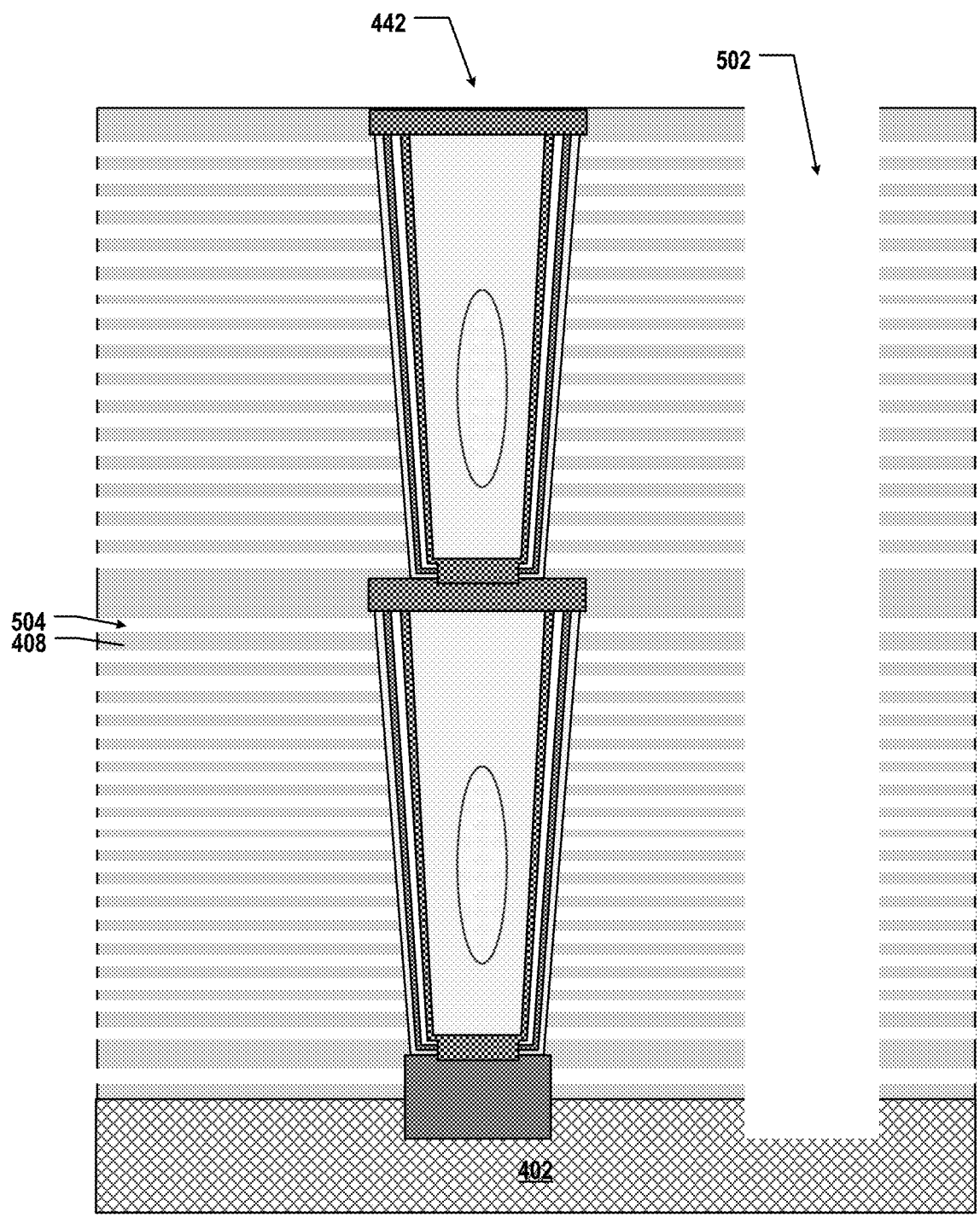
FIGS. 5A-5D illustrate an exemplary fabrication process for forming a 3D memory device with a memory stack having silicon oxynitride gate-to-gate dielectric layers, according to some embodiments of the present disclosure.

Method 1000 proceeds to operation 1004, as illustrated in FIG. 10, in which a slit opening extending vertically through the interleaved sacrificial layers and dielectric layers of the dielectric stack is formed. As illustrated in FIG. 5A, a slit opening 502 is formed by wet etching and/or dry etching (e.g., DRIE) of sacrificial layers and 406 dielectric layers 408 (e.g., polysilicon and silicon nitride) through dielectric stack 428 (as shown in FIG. 4C).

Method 1000 proceeds to operation 1006, as illustrated in FIG. 10, in which a plurality of lateral recesses are formed by removing the sacrificial layers through the slit opening. In some embodiments, to form the plurality of lateral recesses, a wet etchant is applied through the slit opening. The wet etchant can include Tetramethylammonium hydroxide (TMAH). In some embodiments, the polysilicon layers are etched selective to the silicon nitride layers to form the plurality of lateral recesses.

As illustrated in FIG. 5A, lateral recesses 504 are formed by removing sacrificial layers 406 through slit opening 502. In some embodiments, sacrificial layers 406 (as shown in FIG. 4C) are removed by applying etching solutions through slit opening 502, such that sacrificial layers 406 are removed, creating lateral recesses 504 interleaved between dielectric layers 408. In some embodiments in which each sacrificial layer 406 is a polysilicon layer and each dielectric layer 408 is a silicon nitride layer, the polysilicon layers are etched by wet etchant, such as TMAH, which etches polysilicon selective to silicon nitride to form lateral recesses 504. The selectivity between etching polysilicon and etching silicon nitride is higher than that between etching silicon nitride and silicon oxide and thus, can avoid the nonuniform dielectric layer loss occurred to some known 3D memory devices. Due to high wet etch selectivity of silicon to silicon nitride, almost no silicon nitride dielectric layer loss occurs during the removal of polysilicon sacrificial layer removal, according to some embodiments.

Method 1000 proceeds to operation 1008, as illustrated in FIG. 10, in which a plurality of gate-to-gate dielectric layers are formed by oxidizing the dielectric layers through the slit opening and the lateral recesses. In some embodiments, to form the plurality of gate-to-gate dielectric layers, oxygen diffusion concentration is controlled, such that each of the gate-to-gate dielectric layers consists of a silicon oxynitride layer. In some embodiments, to form the plurality of gate-to-gate dielectric layers, oxygen diffusion concentration is controlled, such that each of the gate-to-gate dielectric layers includes the silicon oxynitride layer and at least one silicon oxide layer. Each of the gate-to-gate dielectric layers can include the silicon oxynitride layer stacked between two silicon oxide layers. In some embodiments, the silicon nitride layers are oxidized, such that each of the gate-to-gate dielectric layers includes the silicon oxynitride layer and at least one silicon oxide layer. Each of the silicon nitride layers becomes the silicon oxynitride layer, according to some embodiments. Each of the silicon nitride layers becomes the silicon oxynitride layer and at least one silicon oxide layer, according to some embodiments. Each of the silicon nitride layers can become the silicon oxynitride layer stacked between two silicon oxide layers.

Figure 5B:
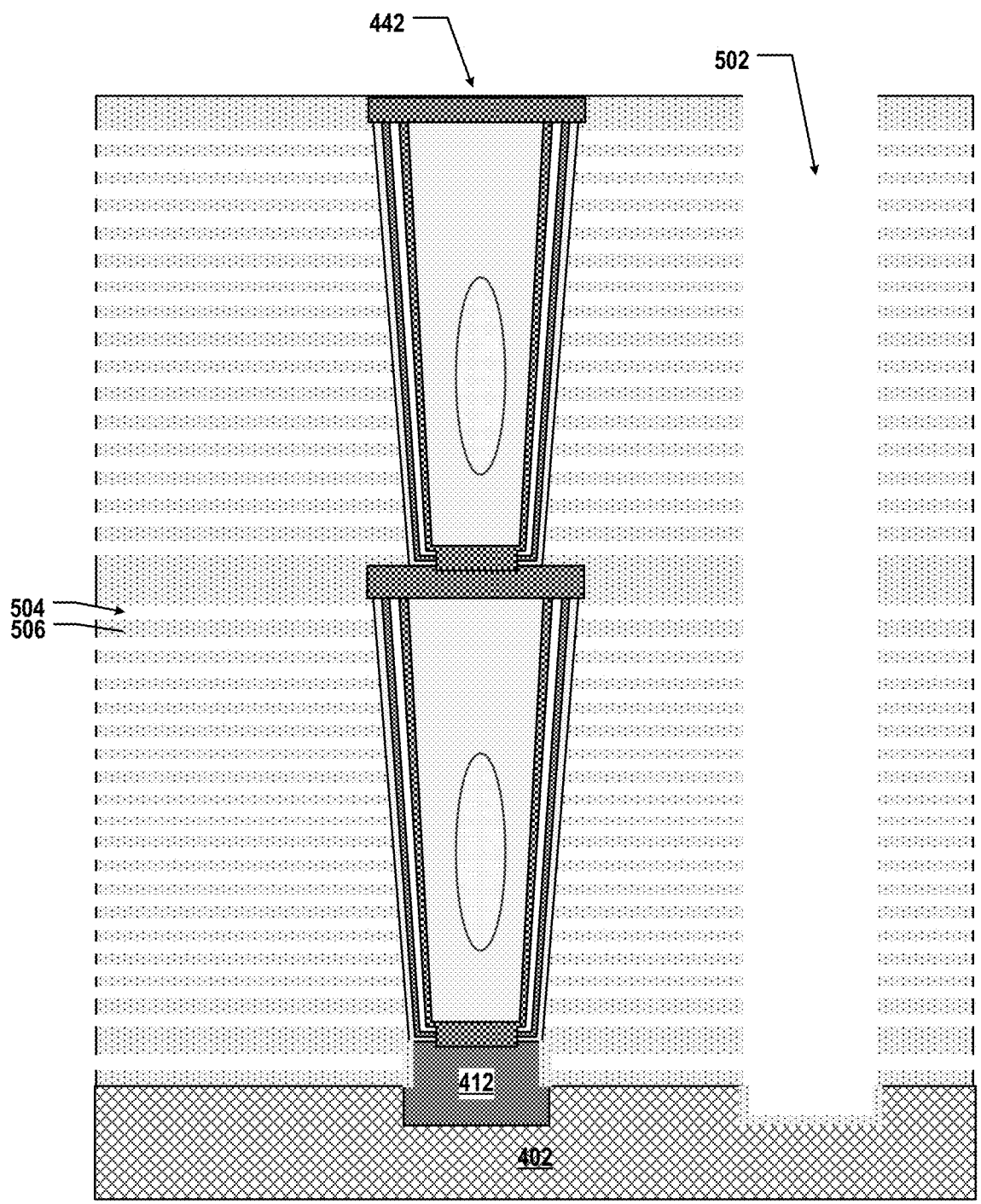
Figure 5B:

As illustrated in FIG. 5B, a plurality of gate-to-gate dielectric layers 506 interleaved between lateral recesses 504 are formed. Each gate-to-gate dielectric layer 506 can include a silicon oxynitride layer formed by oxidizing dielectric layers 408 through slit opening 502 and lateral recesses 504. In some embodiments, the silicon nitride layers are oxidized, such that each of the silicon nitride layers becomes at least a silicon oxynitride layer. The oxidizing process can be thermal oxidation and/or wet chemical oxidation. Either dry oxidation using molecular oxygen as the oxidant or wet oxidation using water vapor as the oxidant can be used to form the silicon oxynitride layers of gate-to-gate dielectric layers 506 at a temperature, for example, not greater than about 850° C. In some embodiments, the thermal oxidation is performed between about 500° C. and about 850° C., such as between 500° C. and 850° C. (e.g., 500° C., 550° C., 600° C., 650° C., 700° C., 750° C., 800° C., 850° C., any range bounded by the lower end by any of these values, or in any range defined by any two of these values). In some embodiments, the thermal oxidation is performed at about 700° C., such as 700° C. Slit opening 502 and lateral recesses 506 can provide passageway for transporting oxygen gas and/or water vapor to silicon nitride dielectric layers 408 (as shown in FIG. 5A). By controlling the oxygen diffusion concentration (e.g., oxygen concentration gradient) during the oxidization process, various types of silicon oxynitride layers of gate-to-gate dielectric layers 506 can be formed from silicon nitride dielectric layers 408. In one example, each gate-to-gate dielectric layer 506 consists of a silicon oxynitride layer, i.e., including only a single silicon oxynitride layer. In another example, each gate-to-gate dielectric layer 506 is a composite layer having a silicon oxynitride layer and at least one silicon oxide layer. For example, each gate-to-gate dielectric layer 506 may include a silicon oxynitride layer stacked between two silicon oxide layers. It is understood that silicon may be oxidized into silicon oxide by the same oxidization process for forming gate-to-gate dielectric layers 506 or by another oxidization process prior to the oxidization process for forming gate-to-gate dielectric layers 506. For example, the sidewall of semiconductor plug 412 and the bottom surface of slit opening 502 may be oxidized into silicon oxide.

Method 1000 proceeds to operation 1010, as illustrated in FIG. 10, in which a memory stack including a plurality of interleaved gate conductive layers and the gate-to-gate dielectric layers is formed by depositing the gate conductive layers into the lateral recesses through the slit opening. In some embodiments, each of the gate conductive layers includes a metal layer. A plurality of metal layers can be deposited into the lateral recesses. In some embodiments, each of the gate conductive layers includes a doped polysilicon layer.

Figure 5C:
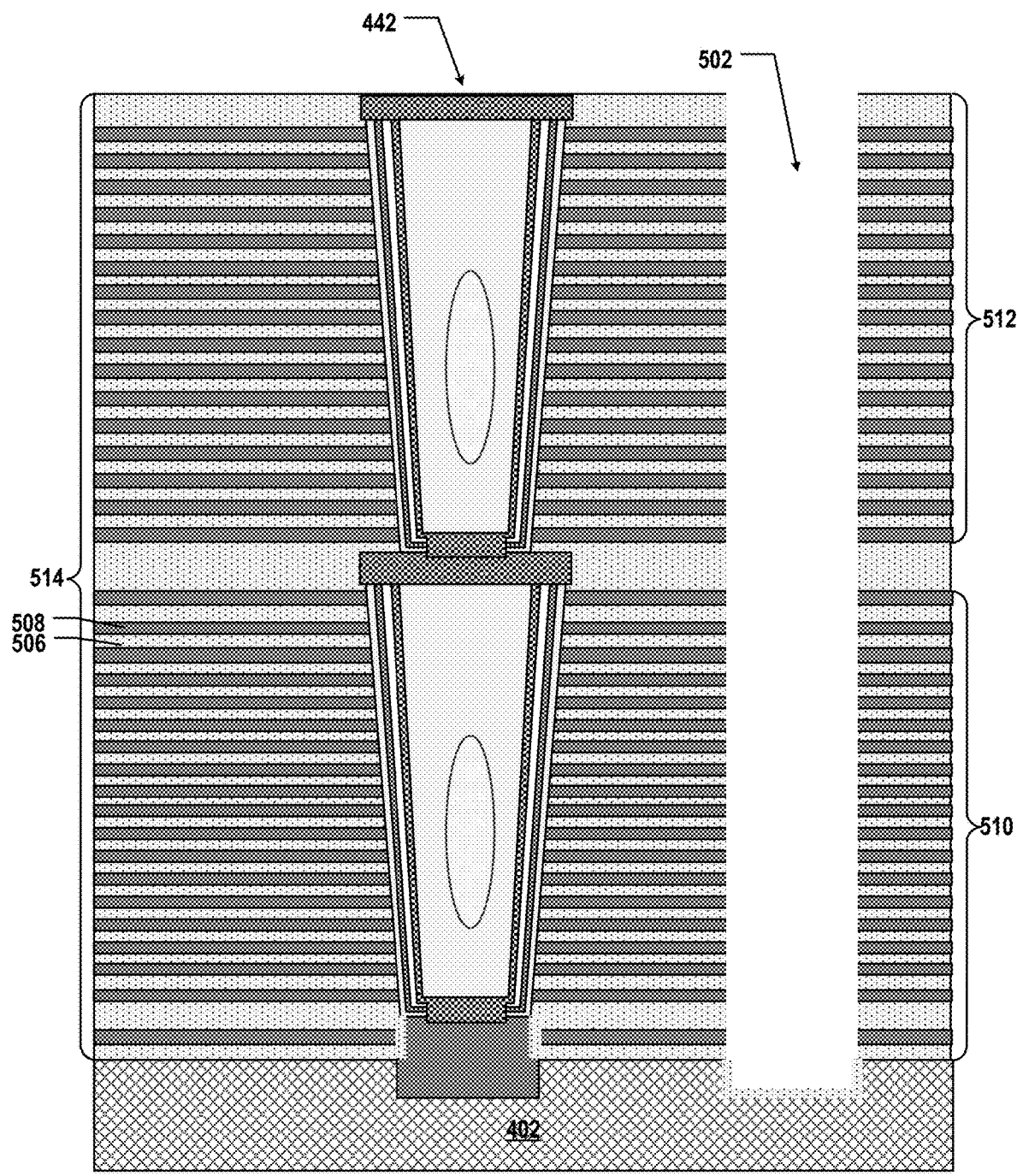
Figure 5C:
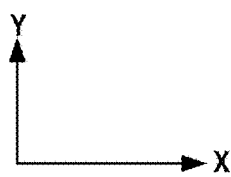

As illustrated in FIG. 5C, a plurality of gate conductive layers 508 are deposited into lateral recesses 504 (as shown in FIG. 5B) through slit opening 502. In some embodiments, gate dielectric layers (not shown) are deposited into lateral recesses 504 priori to gate conductive layers 508, such that gate conductive layers 508 are deposited on the gate dielectric layers. Gate conductive layers 508 can be deposited using one or more thin film deposition processes, such as ALD, CVD, PVD, any other suitable processes, or any combination thereof. Gate conductive layers 508 can include conductive materials. In some embodiments, each gate conductive layer 508 includes a metal layer including, not limited to, W, Co, Cu, Al, or any combination thereof. In some embodiments, each gate conductive layer 508 includes a doped polysilicon layer. The polysilicon layer can be doped using ion implantation and/or thermal diffusion to a desired doping concentration with any suitable dopant to become a conductive material that can be used as the material of gate conductive layers 508. A lower memory deck 510 including a plurality of interleaved gate conductive layers 508 and gate-to-gate dielectric layers 506 is thereby formed, which replaces lower dielectric deck 404. An upper memory deck 512 including a plurality of interleaved gate conductive layers 508 and gate-to-gate dielectric layers 506 is thereby formed, which replaces upper dielectric deck 426. As a result, a memory stack 514 including lower and upper memory decks 510 and 512 is thereby formed, which replaces dielectric stack 428. NAND memory string 442 (having a DCF structure) is thereby formed extending vertically through memory stack 514 including a plurality of interleaved gate conductive layers 508 and gate-to-gate dielectric layers 506.

Figure 5D:
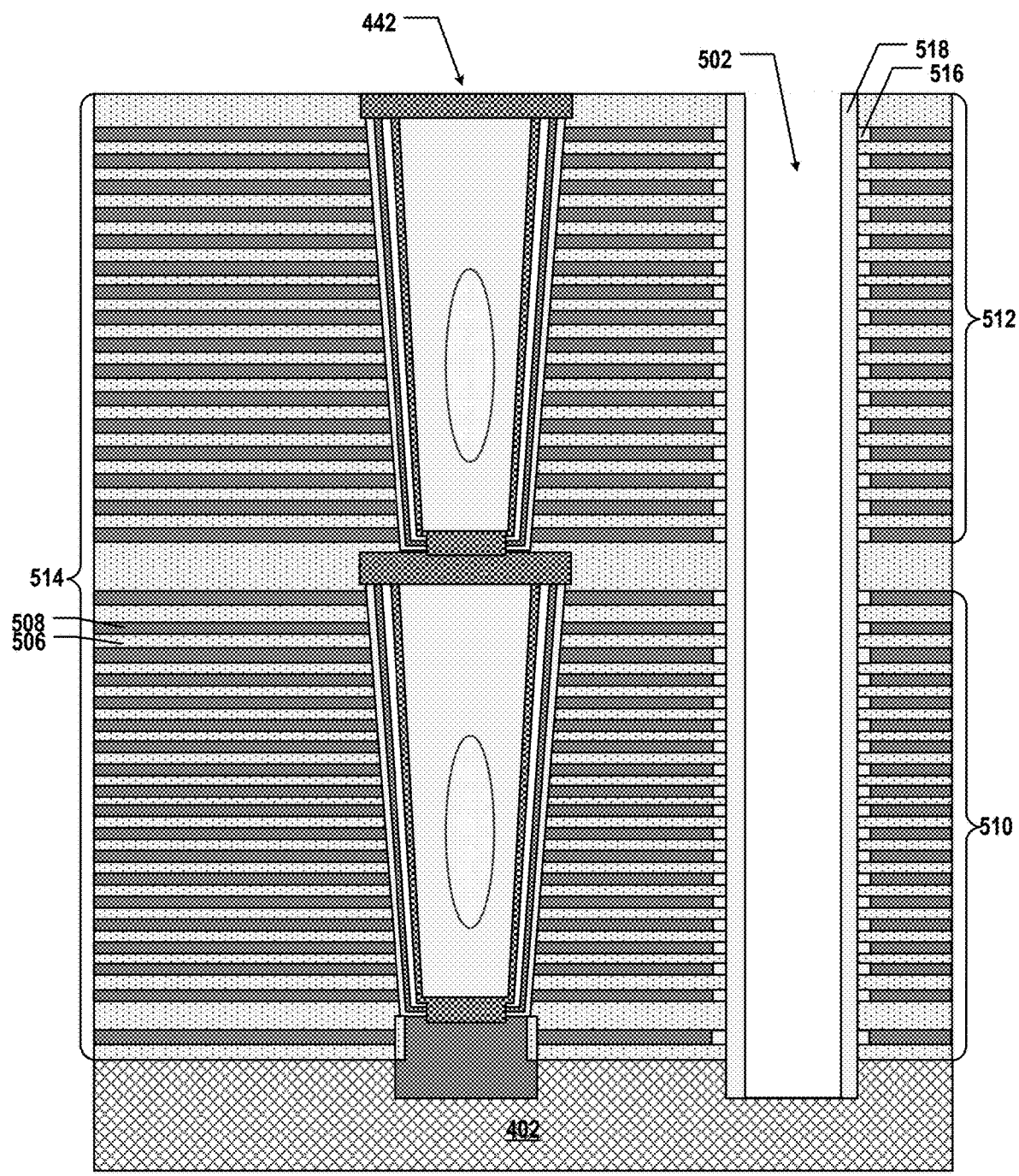

As illustrated in FIG. 5D, etch-back recesses 516 are formed in each gate conductive layer 508 abutting the sidewall of slit opening 502. Etch-back recesses 516 can be etched-back using wet etching and/or dry etching processes through slit opening 502. A spacer 518 including one or more dielectric layers, such as silicon oxide and silicon nitride, is deposited into etch-back recesses 516 and along the sidewall of slit opening 502 using one or more thin film deposition processes, such as ALD, CVD, PVD, any other suitable processes, or any combination thereof. In some embodiments, a conductor layer is then deposited over spacer 518 to fill the remaining space of slit opening 502 to form a slit contact (not shown).

Figure 8A:
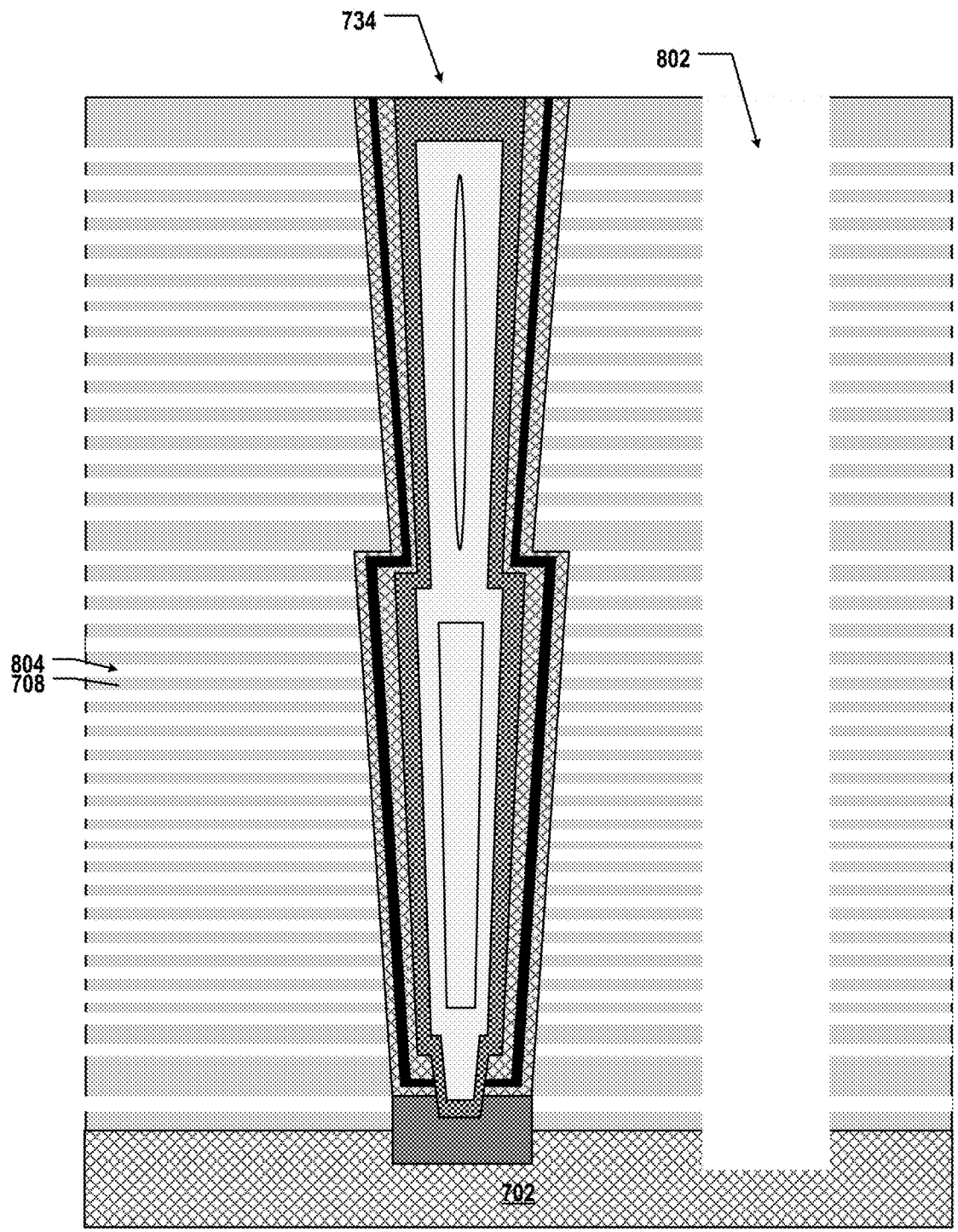
FIGS. 8A-8D illustrate an exemplary fabrication process for forming another 3D memory device with a memory stack having silicon oxynitride gate-to-gate dielectric layers, according to some embodiments of the present disclosure.

Similarly, NAND memory string 734 (having a SCF structure) can be formed extending vertically through a memory stack 814 including a plurality of interleaved gate conductive layers 808 and gate-to-gate dielectric layers 806, as illustrated in FIGS. 8A-8D. As illustrated in FIG. 8A, lateral recesses 804 are formed by removing sacrificial layers 706 through slit opening 802. In some embodiments, sacrificial layers 706 (as shown in FIG. 7C) are removed by applying etching solutions through slit opening 802, such that sacrificial layers 706 are removed, creating lateral recesses 804 interleaved between dielectric layers 708. In some embodiments in which each sacrificial layer 706 is a polysilicon layer and each dielectric layer 708 is a silicon nitride layer, the polysilicon layers are etched by wet etchant, such as TMAH, which etches polysilicon selective to silicon nitride to form lateral recesses 804.

Figure 8B:
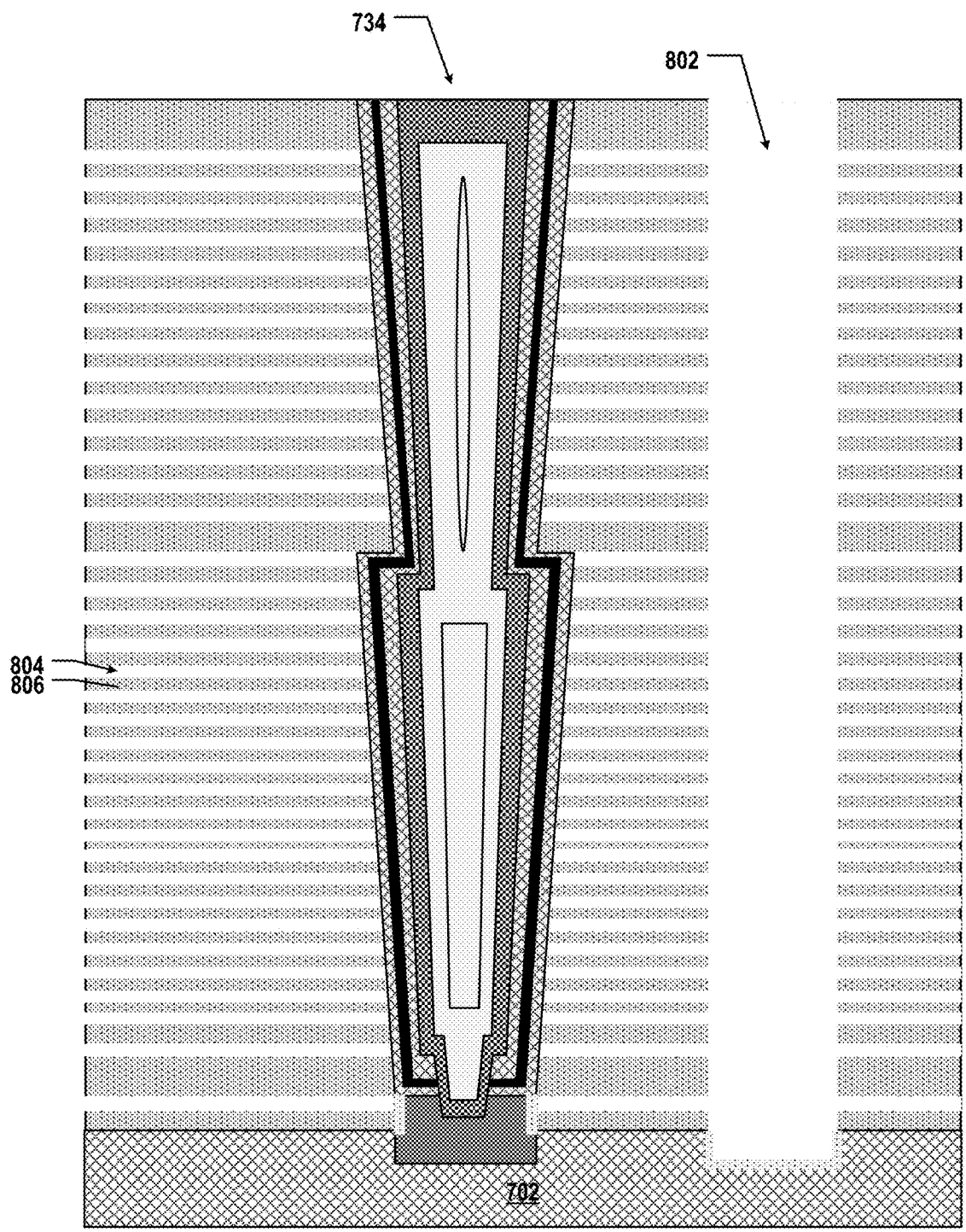

As illustrated in FIG. 8B, a plurality of gate-to-gate dielectric layers 806 interleaved between lateral recesses 804 are formed. Each gate-to-gate dielectric layer 806 can include a silicon oxynitride layer formed by oxidizing dielectric layers 708 (as shown in FIG. 7C) through slit opening 802 and lateral recesses 804. In some embodiments, the silicon nitride layers are oxidized, such that each of the silicon nitride layers becomes at least a silicon oxynitride layer. The oxidizing process can be thermal oxidation and/or wet chemical oxidation. Either dry oxidation using molecular oxygen as the oxidant or wet oxidation using water vapor as the oxidant can be used to form the silicon oxynitride layers of gate-to-gate dielectric layers 806.

Figure 8C:
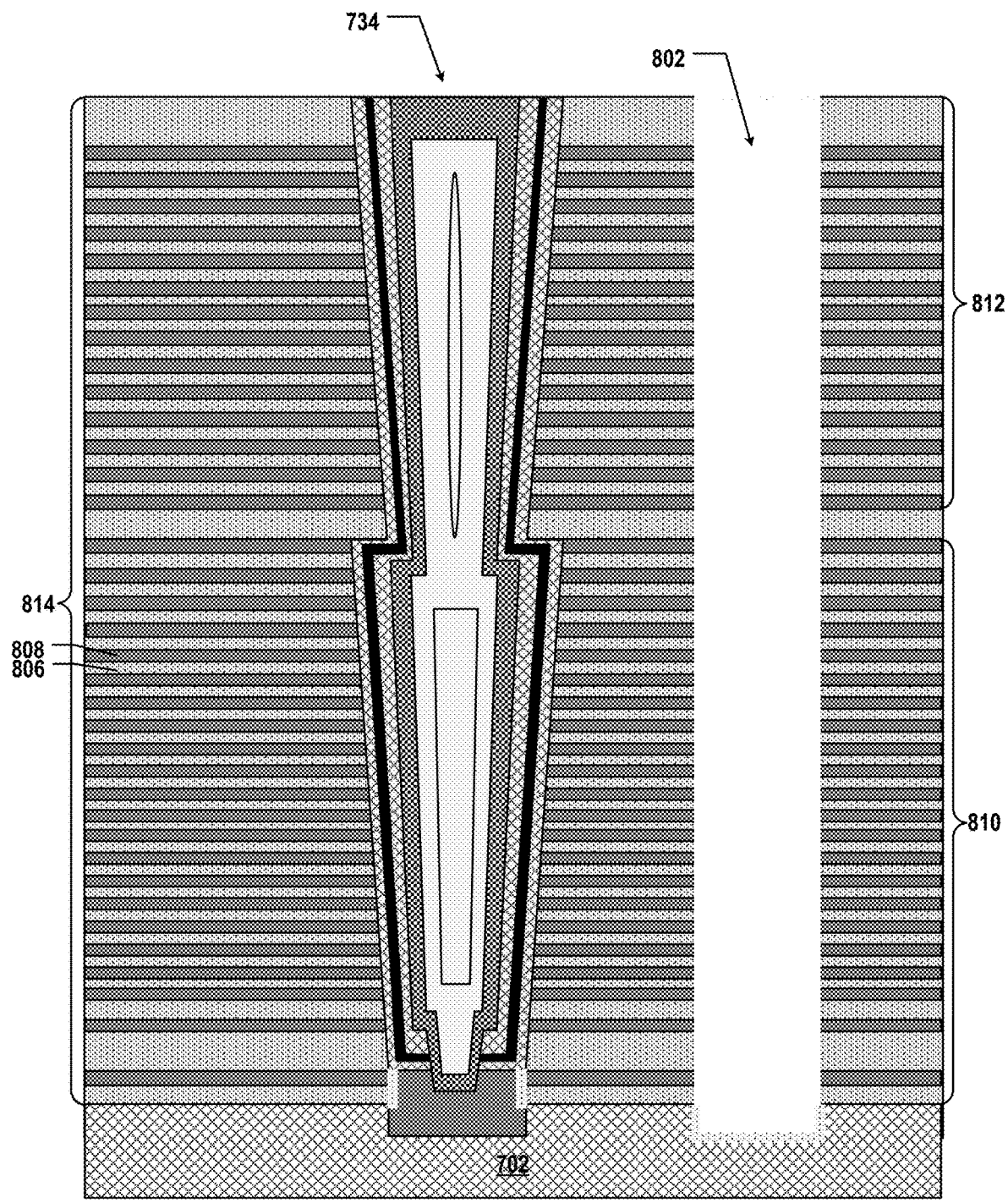

As illustrated in FIG. 8C, a plurality of gate conductive layers 808 are deposited into lateral recesses 804 (as shown in FIG. 8B) through slit opening 802. In some embodiments, gate dielectric layers (not shown) are deposited into lateral recesses 804 priori to gate conductive layers 808, such that gate conductive layers 808 are deposited on the gate dielectric layers. Gate conductive layers 808 can be deposited using one or more thin film deposition processes, such as ALD, CVD, PVD, any other suitable processes, or any combination thereof. Each gate conductive layer 808 can include a metal layer or a doped polysilicon layer. A lower memory deck 810 including a plurality of interleaved gate conductive layers 808 and gate-to-gate dielectric layers 806 is thereby formed, which replaces lower dielectric deck 704. An upper memory deck 812 including a plurality of interleaved gate conductive layers 808 and gate-to-gate dielectric layers 806 is thereby formed, which replaces upper dielectric deck 718. As a result, a memory stack 814 including lower and upper memory decks 810 and 812 is thereby formed, which replaces dielectric stack 722. NAND memory string 734 (having a SCF structure) is thereby formed extending vertically through memory stack 814 including a plurality of interleaved gate conductive layers 808 and gate-to-gate dielectric layers 806.

Figure 8D:
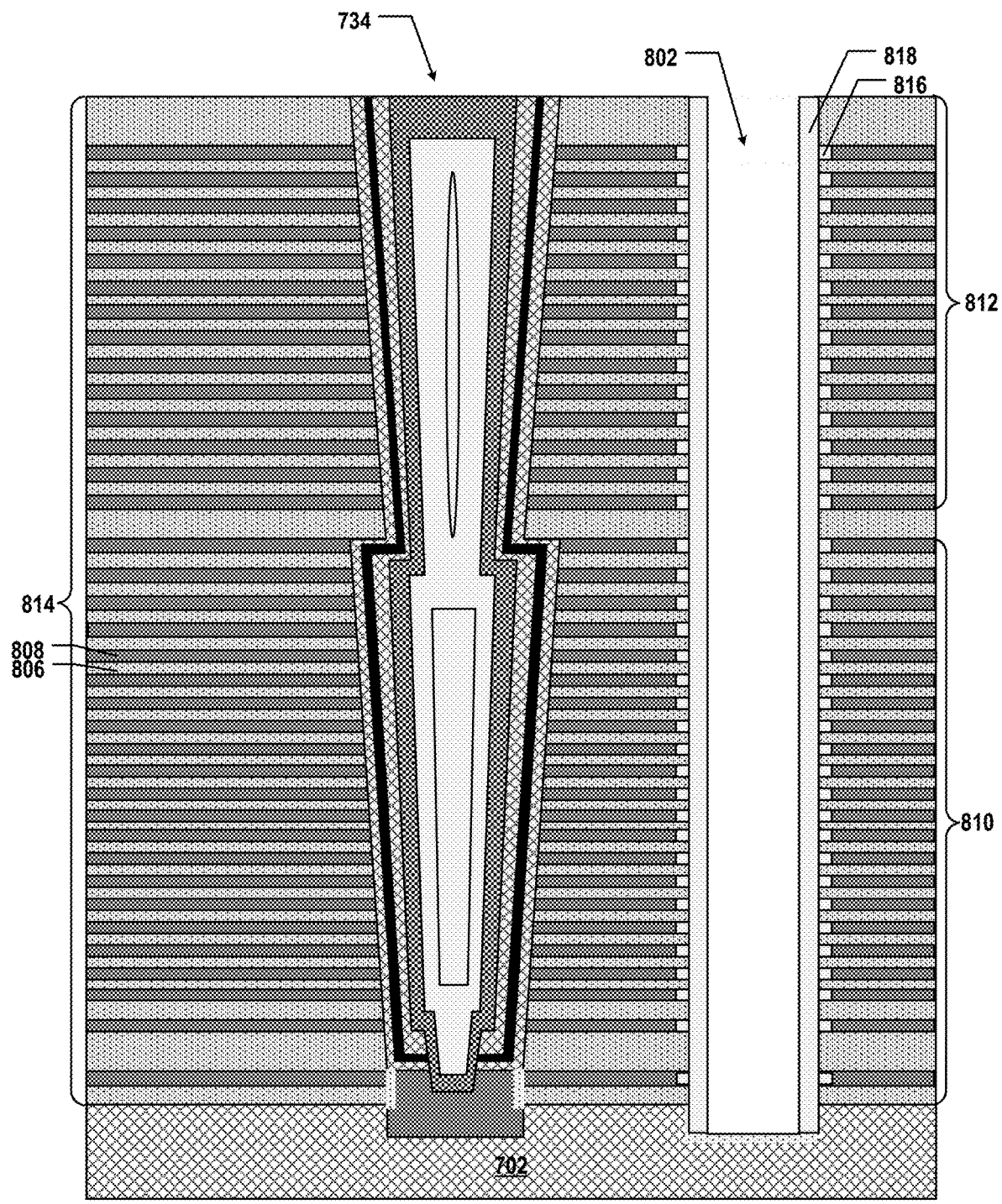

As illustrated in FIG. 8D, etch-back recesses 816 are formed in each gate conductive layer 808 abutting the sidewall of slit opening 802. Etch-back recesses 816 can be etched-back using wet etching and/or dry etching processes through slit opening 802. A spacer 818 including one or more dielectric layers, such as silicon oxide and silicon nitride, is deposited into etch-back recesses 816 and along the sidewall of slit opening 802 using one or more thin film deposition processes, such as ALD, CVD, PVD, any other suitable processes, or any combination thereof. In some embodiments, a conductor layer is then deposited over spacer 818 to fill the remaining space of slit opening 802 to form a slit contact (not shown).

Figure 6A:
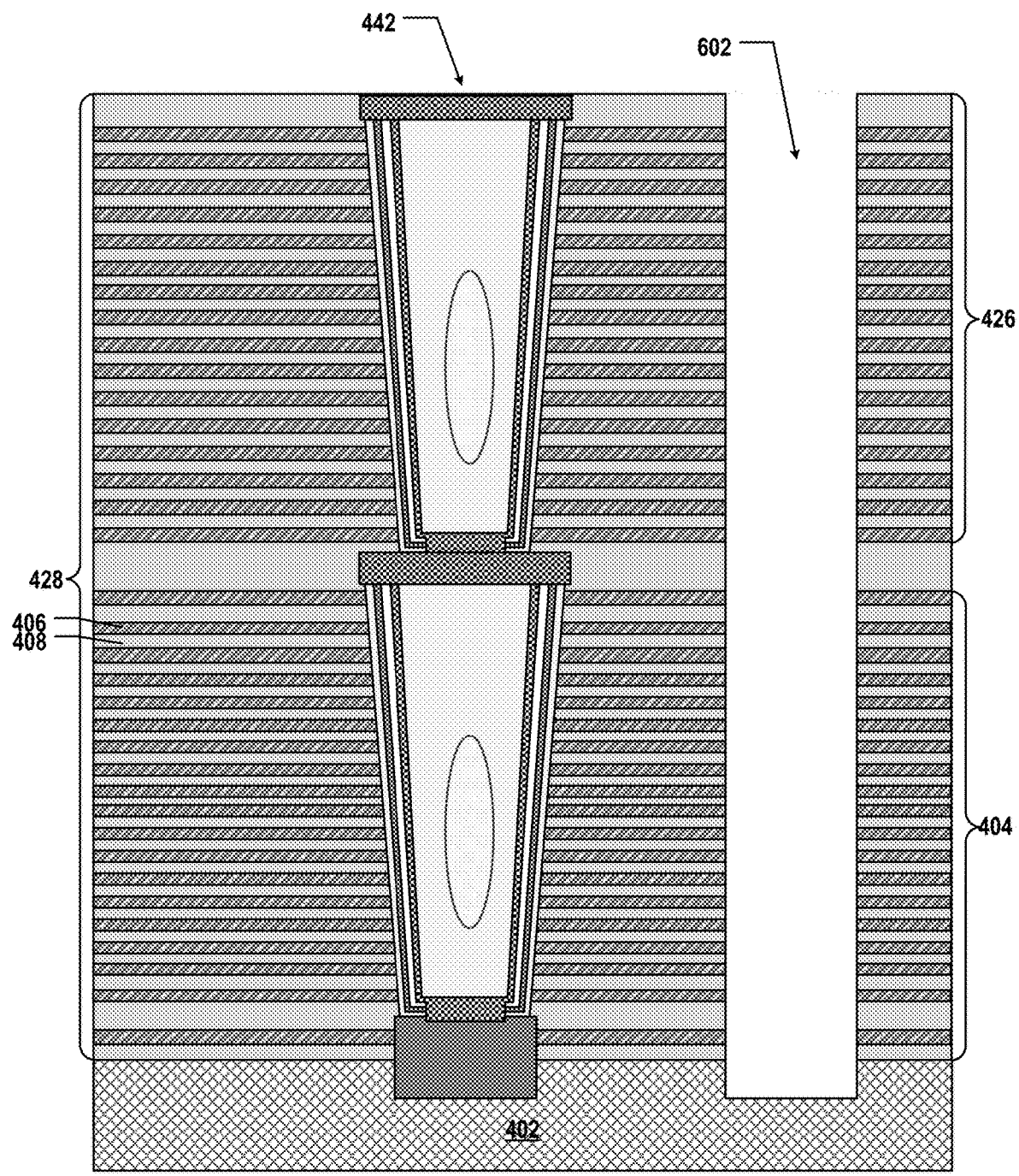
FIGS. 6A and 6B illustrate an exemplary fabrication process for forming a 3D memory device with a memory stack having silicon nitride gate-to-gate dielectric layers, according to some embodiments of the present disclosure.
Figure 6B:
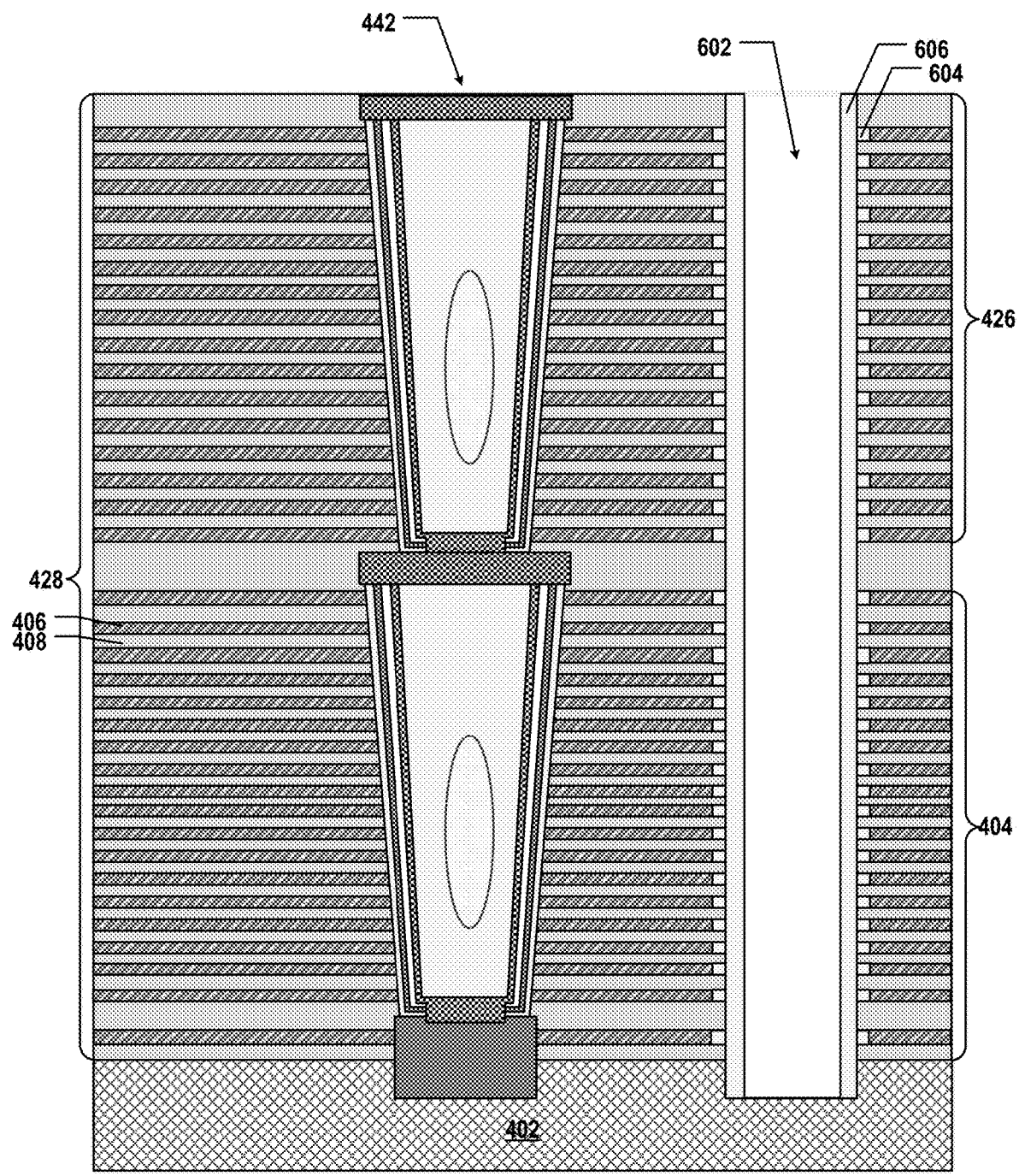
Figure 9A:
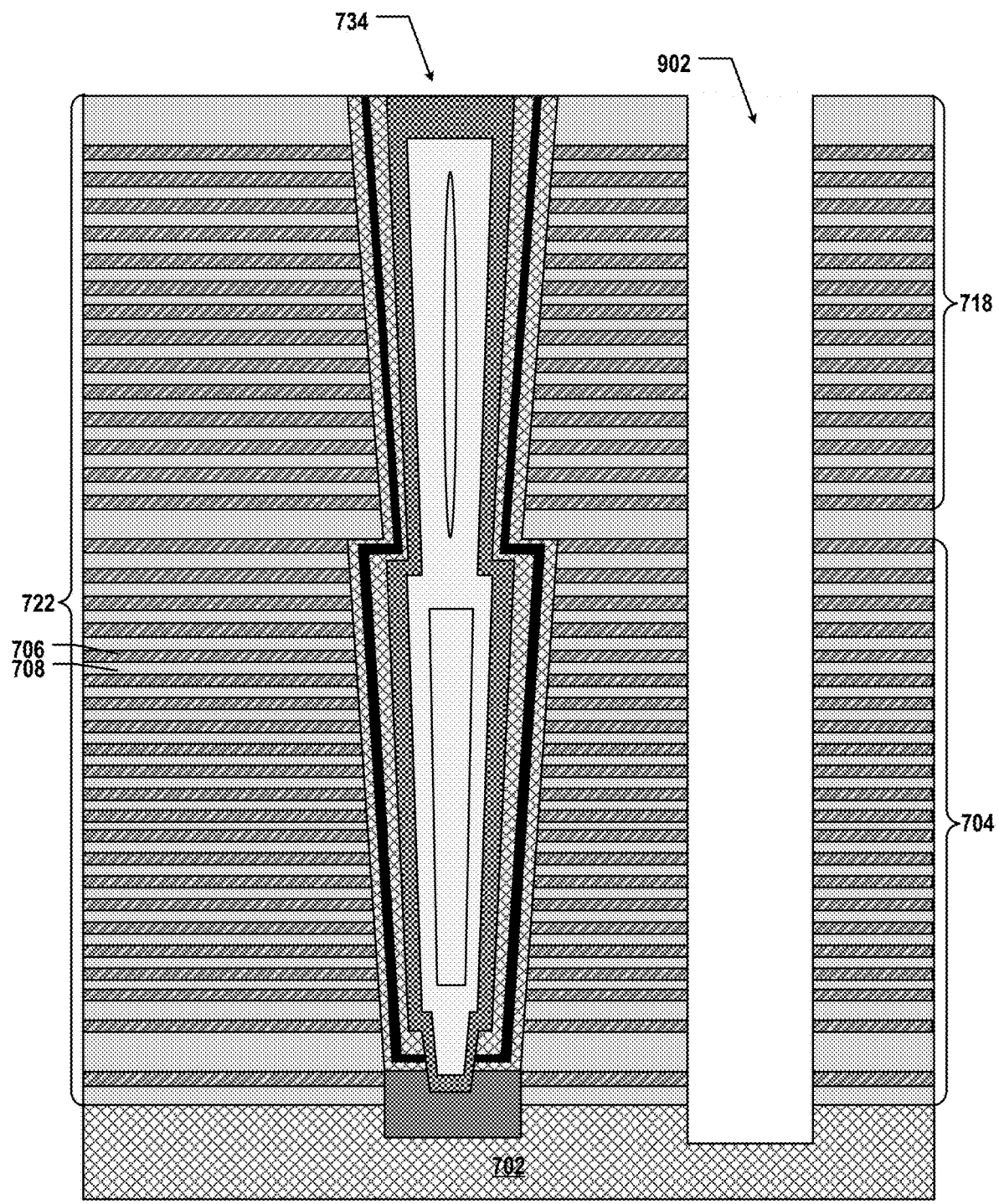
FIGS. 9A and 9B illustrate an exemplary fabrication process for forming another 3D memory device with a memory stack having silicon nitride gate-to-gate dielectric layers, according to some embodiments of the present disclosure.
Figure 9B:
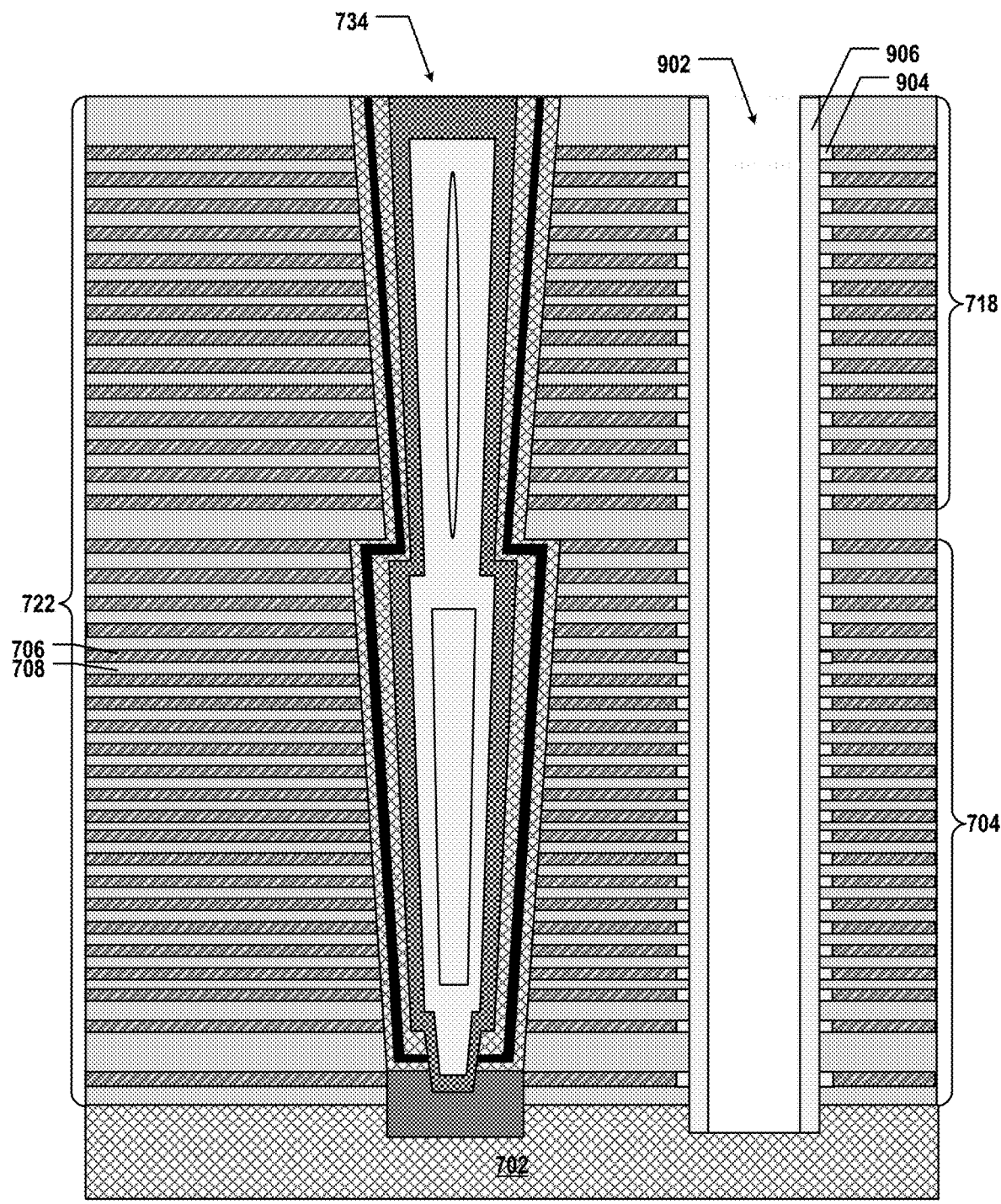
Figure 11:
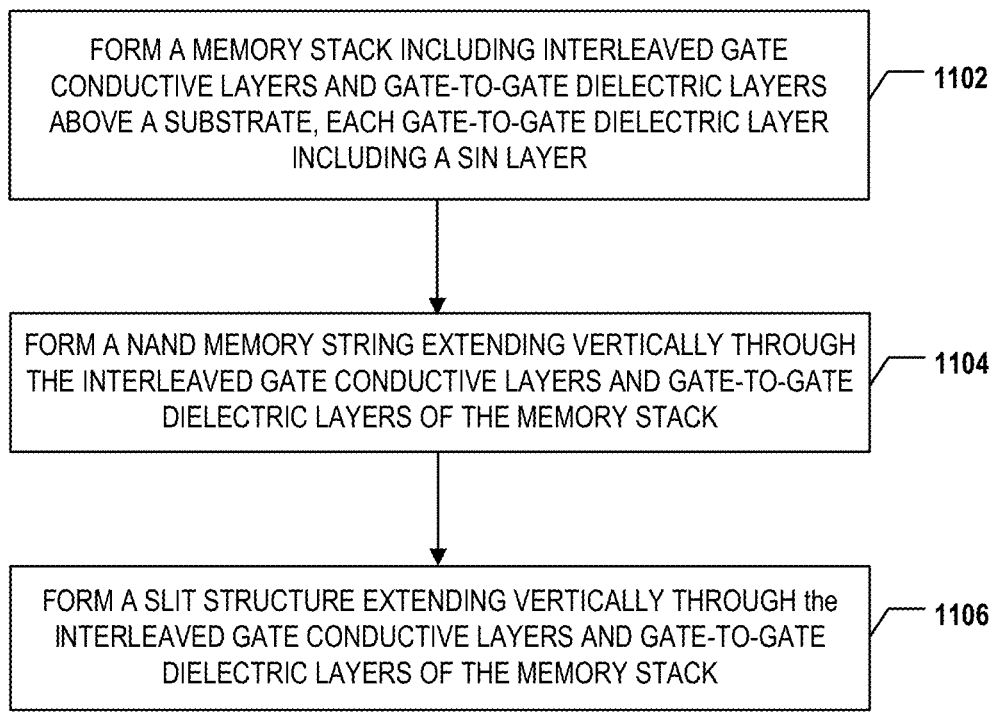
FIG. 11 illustrates a flowchart of an exemplary method for forming a 3D memory device with a memory stack having silicon nitride gate-to-gate dielectric layers, according to some embodiments of the present disclosure.

FIGS. 4A-4C illustrate an exemplary fabrication process for forming a NAND memory string, according to some embodiments of the present disclosure. FIGS. 6A and 6B illustrate an exemplary fabrication process for forming a 3D memory device with a memory stack having silicon nitride gate-to-gate dielectric layers, according to some embodiments of the present disclosure. FIGS. 7A-7C illustrate an exemplary fabrication process for forming another NAND memory string, according to some embodiments of the present disclosure. FIGS. 9A and 9B illustrate an exemplary fabrication process for forming another 3D memory device with a memory stack having silicon nitride gate-to-gate dielectric layers, according to some embodiments of the present disclosure. FIG. 11 illustrates a flowchart of an exemplary method 1100 for forming a 3D memory device with a memory stack having silicon nitride gate-to-gate dielectric layers, according to some embodiments of the present disclosure. Examples of the 3D memory device depicted in FIGS. 4A-4C, 6A, 6B, 7A-7C, 9A, and 9B include 3D memory devices 300 and 301 depicted in FIGS. 3A and 3B. FIGS. 4A-4C, 6A, 6B, 7A-7C, 9A, 9B, and 11 will be described together. It is understood that the operations shown in method 1100 are not exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which a memory stack including a plurality of interleaved gate conductive layers and gate-to-gate dielectric layers is formed above a substrate. Each of the gate-to-gate dielectric layers includes a silicon nitride layer. In some embodiments, each of the gate conductive layers includes a doped polysilicon layer. In some embodiments, each of the gate conductive layers includes a metal layer. To form the memory stack, a first memory deck is formed, and a second memory deck is formed above the first memory deck. In some embodiments, a plurality of doped polysilicon layers and a plurality of silicon nitride layers are alternatingly deposited above the substrate to form the memory stack.

Method 1100 proceeds to operation 1104, as illustrated in FIG. 11, in which a NAND memory string extending vertically through the interleaved gate conductive layers and gate-to-gate dielectric layers of the memory stack is formed. In some embodiments, to form the NAND memory string, a first channel structure extending vertically through the first memory deck is formed, an inter-deck plug is formed above and in contact with the first channel structure, and a second channel structure extending vertically through the second memory deck is formed above and in contact with the inter-deck plug. In some embodiments, to form the NAND memory string, a single channel structure extending vertically through the first and second memory decks is formed. In some embodiments, a channel structure extending vertically through the doped polysilicon layers and silicon nitride layers is formed. In some embodiments, to form the channel structure, a channel hole extending vertically through the doped polysilicon layers and silicon nitride layers and into the substrate is etched, a semiconductor plug is epitaxially grown from the substrate onto a bottom surface of the channel hole, and a memory film and a semiconductor channel are subsequently deposited along a sidewall of the channel hole and above the semiconductor plug.

As described above in detail with respect to FIGS. 4A-4C, NAND memory string 442 (having a DCF structure) extending vertically through interleaved gate conductive layers 406 and gate-to-gate dielectric layers 408 is formed. It is understood that although layers 406 and 408 are described as sacrificial layers and dielectric layers above, respectively, with respect to FIG. 10, layers 406 and 408 may be used as gate conductive layers and gate-to-gate dielectric layers, respectively, as well with respect to FIG. 11. In some embodiments, each gate conductive layer 406 includes a metal layer. In some embodiments, each gate conductive layer 406 includes a doped polysilicon layer. Each gate-to-gate dielectric layer 408 can include a silicon nitride layer. The details of forming NAND memory string 442 extending vertically through memory stack 428 including interleaved gate conductive layers 406 and gate-to-gate dielectric layers 408 are described above and thus, are not repeated. Different from the example described above with respect to FIG. 10, an oxidization process may not be used in this example, such that each gate-to-gate dielectric layer 408 does not include a silicon oxide layer or a silicon oxynitride layer.

Similarly, as described above in detail with respect to FIGS. 7A-7C, NAND memory string 734 (having a SCF structure) extending vertically through interleaved gate conductive layers 706 and gate-to-gate dielectric layers 708 is formed. It is understood that although layers 706 and 708 are described as sacrificial layers and dielectric layers above, respectively, with respect to FIG. 10, layers 706 and 708 may be used as gate conductive layers and gate-to-gate dielectric layers, respectively, as well with respect to FIG. 11. In some embodiments, each gate conductive layer 706 includes a metal layer. In some embodiments, each gate conductive layer 706 includes a doped polysilicon layer. Each gate-to-gate dielectric layer 708 can include a silicon nitride layer. The details of forming NAND memory string 734 extending vertically through memory stack 722 including interleaved gate conductive layers 706 and gate-to-gate dielectric layers 708 are described above and thus, are not repeated. Different from the example described above with respect to FIG. 10, an oxidization process may not be used in this example, such that each gate-to-gate dielectric layer 708 does not include a silicon oxide layer or a silicon oxynitride layer.

Method 1100 proceeds to operation 1106, as illustrated in FIG. 11, in which a slit structure extending vertically through the interleaved gate conductive layers and gate-to-gate dielectric layers of the memory stack is formed. In some embodiments, to form the slit structure, a slit opening extending vertically through the interleaved gate conductive layers and gate-to-gate dielectric layers of the memory stack is formed, an etch-back recess is formed in each of the gate conductive layers abutting a sidewall of the slit opening, and a spacer is formed in the etch-back recesses and along the sidewall of the slit opening.

As illustrated in FIG. 6A, a slit opening 602 is formed by wet etching and/or dry etching (e.g., DRIE) of gate conductive layers 406 and gate-to-gate dielectric layers 408 (e.g., polysilicon layers and silicon nitride layers, respectively) through memory stack 428. As illustrated in FIG. 6B, etch-back recesses 604 are formed in each gate conductive layer 406 abutting the sidewall of slit opening 602. Etch-back recesses 604 can be etched-back using wet etching and/or dry etching processes through slit opening 602. A spacer 606 including one or more dielectric layers, such as silicon oxide and silicon nitride, is deposited into etch-back recesses 604 and along the sidewall of slit opening 602 using one or more thin film deposition processes, such as ALD, CVD, PVD, any other suitable processes, or any combination thereof. In some embodiments, a conductor layer is then deposited over spacer 606 to fill the remaining space of slit opening 602 to form a slit contact (not shown).

Similarly, as illustrated in FIG. 9A, a slit opening 902 is formed by wet etching and/or dry etching (e.g., DRIE) of gate conductive layers 706 and gate-to-gate dielectric layers 708 (e.g., polysilicon layers and silicon nitride layers, respectively) through memory stack 722. As illustrated in FIG. 9B, etch-back recesses 904 are formed in each gate conductive layer 706 abutting the sidewall of slit opening 902. Etch-back recesses 904 can be etched-back using wet etching and/or dry etching processes through slit opening 902. A spacer 906 including one or more dielectric layers, such as silicon oxide and silicon nitride, is deposited into etch-back recesses 904 and along the sidewall of slit opening 902 using one or more thin film deposition processes, such as ALD, CVD, PVD, any other suitable processes, or any combination thereof. In some embodiments, a conductor layer is then deposited over spacer 906 to fill the remaining space of slit opening 902 to form a slit contact (not shown).

According to one aspect of the present disclosure, a 3D memory device includes a substrate, a memory stack, and a NAND memory string. The memory stack includes a plurality of interleaved gate conductive layers and gate-to-gate dielectric layers above the substrate. Each of the gate-to-gate dielectric layers includes a silicon nitride layer. The NAND memory string extends vertically through the interleaved gate conductive layers and gate-to-gate dielectric layers of the memory stack.

In some embodiments, each of the gate conductive layers includes a doped polysilicon layer. In some embodiments, each of the gate conductive layers includes a metal layer.

In some embodiments, the memory stack includes a first memory deck above the substrate and a second memory deck above the first memory deck.

In some embodiments, the NAND memory string includes a first channel structure extending vertically through the first memory deck, a second channel structure extending vertically through the second memory deck, and an inter-deck plug vertically between and in contact with the first channel structure and the second channel structure, respectively. In some embodiments, the NAND memory string includes a single channel structure extending vertically through the first memory deck and the second memory deck.

In some embodiments, each of the gate-to-gate dielectric layers does not include a silicon oxide layer. In some embodiments, each of the gate-to-gate dielectric layers does not include a silicon oxynitride layer.

According to another aspect of the present disclosure, a method for forming a 3D memory device is disclosed. a memory stack including a plurality of interleaved gate conductive layers and gate-to-gate dielectric layers above a substrate is formed. Each of the gate-to-gate dielectric layers includes a silicon nitride layer. A NAND memory string extending vertically through the interleaved gate conductive layers and gate-to-gate dielectric layers of the memory stack is formed. A slit structure extending vertically through the interleaved gate conductive layers and gate-to-gate dielectric layers of the memory stack is formed.

In some embodiments, each of the gate conductive layers includes a doped polysilicon layer. In some embodiments, each of the gate conductive layers includes a metal layer.

In some embodiments, to form the memory stack, a first memory deck is formed, and a second memory deck is formed above the first memory deck.

In some embodiments, to form the NAND memory string, a first channel structure extending vertically through the first memory deck is formed. an inter-deck plug is formed above and in contact with the first channel structure, and a second channel structure extending vertically through the second memory deck is formed above and in contact with the inter-deck plug. In some embodiments, to form the NAND memory string, a single channel structure extending vertically through the first and second memory decks is formed.

In some embodiments, to form the slit structure, a slit opening extending vertically through the interleaved gate conductive layers and gate-to-gate dielectric layers of the memory stack is formed, an etch-back recess is formed in each of the gate conductive layers abutting a sidewall of the slit opening, and a spacer is formed in the etch-back recesses and along the sidewall of the slit opening.

In some embodiments, each of the gate-to-gate dielectric layers does not include a silicon oxide layer. In some embodiments, each of the gate-to-gate dielectric layers does not include a silicon oxynitride layer.

According to still another aspect of the present disclosure, a method for forming a 3D memory device is disclosed. A plurality of doped polysilicon layers and a plurality of silicon nitride layers are alternatingly deposited above a substrate. A channel structure extending vertically through the doped polysilicon layers and silicon nitride layers is formed. A slit opening extending vertically through the doped polysilicon layers and the silicon nitride layers is etched. An etch-back recess is etched in each of the doped polysilicon layers abutting a sidewall of the slit opening. A dielectric layer is deposited in the etch-back recesses and along the sidewall of the slit opening.

In some embodiments, to form the channel structure, a channel hole extending vertically through the doped polysilicon layers and silicon nitride layers and into the substrate is formed, a semiconductor plug is epitaxially grown from the substrate onto a bottom surface of the channel hole, and a memory film and a semiconductor channel are subsequently deposited along a sidewall of the channel hole and above the semiconductor plug.

In some embodiments, the semiconductor plug includes single-crystal silicon.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack comprising a plurality of interleaved gate conductive layers and gate-to-gate dielectric layers, wherein each of the gate-to-gate dielectric layers comprises at least one silicon oxynitride layer and at least one silicon oxide layer, and in each of the gate-to-gate dielectric layers, a surface of the at least one silicon oxynitride layer being fully covered by the at least one silicon oxide layer along a lateral direction; and
a NAND memory string extending vertically through the interleaved gate conductive layers and gate-to-gate dielectric layers of the memory stack, the lateral direction being perpendicular to a vertical direction that the NAND memory string extends,
wherein:
each of the gate conductive layers comprises a doped polysilicon layer;
the memory stack comprises a first memory deck, a second memory deck above the first memory deck, and an inter-deck dielectric layer between the first memory deck and the second memory deck, the inter-deck dielectric layer comprising a same material as the gate-to-gate dielectric layers and being in direct contact with the first memory deck and the second memory deck; and the inter-deck dielectric layer fully covers a top surface of the first memory deck and a bottom surface of the second memory deck, and a portion of the inter-deck dielectric layer that is in direct contact with a sidewall of a channel plug extends continuously along the lateral direction to have direct contact with a slit structure.

2. The 3D memory device of claim 1, wherein the NAND memory string comprises a first channel structure extending vertically through the first memory deck, a second channel structure extending vertically through the second memory deck, and an inter-deck plug vertically between and in contact with the first channel structure and the second channel structure, respectively, wherein the inter-deck plug is above the first channel structure, and is surrounded and isolated from the inter-deck dielectric layer by the second channel structure.

3. The 3D memory device of claim 1, wherein each of the gate-to-gate dielectric layers comprises a silicon oxynitride layer and a pair of silicon oxide layers, the silicon oxynitride layer being between the pair of silicon oxide layers, and in each of the gate-to-gate dielectric layers, a top surface of the silicon oxynitride layer being fully covered by one of the silicon oxide layers, and a bottom surface of the silicon oxynitride layer being fully covered by another of the silicon oxide layers, along the lateral direction.

4. A three-dimensional (3D) memory device, comprising:
a memory stack comprising a plurality of interleaved gate conductive layers and gate-to-gate dielectric layers, wherein each of the gate-to-gate dielectric layers comprises at least one silicon oxide layer and at least one silicon oxynitride layer; and
a NAND memory string extending vertically through the interleaved gate conductive layers and gate-to-gate dielectric layers of the memory stack,
wherein:
the memory stack comprises a first memory deck, a second memory deck above the first memory deck, and an inter-deck dielectric layer between and in direct contact with the first memory deck and the second memory deck;
the NAND memory string comprises a first channel structure extending vertically through the first memory deck, a second channel structure extending vertically through the second memory deck, and an inter-deck plug vertically between and in contact with the first channel structure and the second channel structure;
the inter-deck dielectric layer fully covers a top surface of the first memory deck and a bottom surface of the second memory deck; and
a slit structure extends vertically through the first memory deck and the second memory deck, and a portion of the inter-deck dielectric layer that is in direct contact with a sidewall of a channel plug extends continuously along a lateral direction to have direct contact with the slit structure, the lateral direction being perpendicular to a vertical direction that the NAND memory string extends.

5. The 3D memory device of claim 4, wherein each of the gate conductive layers comprises a doped polysilicon layer.

6. The 3D memory device of claim 4, wherein each of the gate conductive layers comprises a metal layer.

7. A three-dimensional (3D) memory device, comprising:
a substrate;

a memory stack comprising a plurality of interleaved gate conductive layers and gate-to-gate dielectric layers above the substrate, wherein each of the gate-to-gate dielectric layers comprises at least one silicon oxynitride layer and at least one silicon oxide layer, and in each of the gate-to-gate dielectric layers, a surface of the at least one silicon oxynitride layer being fully covered by the at least one silicon oxide layer along a lateral direction; and
a NAND memory string extending vertically through the interleaved gate conductive layers and gate-to-gate dielectric layers of the memory stack, the lateral direction being perpendicular to a vertical direction that the NAND memory string extends,
wherein:
the memory stack comprises a first memory deck above the substrate, a second memory deck above the first memory deck, and an inter-deck dielectric layer between and in direct contact with each of the first memory deck and the second memory deck,
the NAND memory string comprises a first channel structure extending vertically through the first memory deck, a second channel structure extending vertically through the second memory deck, a channel plug in an upper portion of the first channel structure, and an inter-deck plug above and in contact with the channel plug and the second channel structure, the inter-deck plug being surrounded by the second channel structure, and the channel plug being in direct contact with and surrounded by the inter-deck dielectric layer;
a slit structure extends vertically through the memory stack and comprises a spacer on a sidewall of the slit structure and extending into the substrate; and
a portion of the inter-deck dielectric layer that is in direct contact with a sidewall of the channel plug extends continuously along the lateral direction to have direct contact with the spacer of the slit structure.

8. The 3D memory device of claim 7, wherein each of the gate conductive layers comprises a doped polysilicon layer.

9. The 3D memory device of claim 7, wherein each of the gate conductive layers comprises a metal layer.

10. The 3D memory device of claim 7, wherein the inter-deck plug is vertically between and in contact with the first channel structure and the second channel structure, respectively, and is between the first memory deck and the second memory deck.

11. The 3D memory device of claim 4, wherein the NAND memory string further comprises the channel plug in an upper portion of the first channel structure, the channel plug comprising a different material from a material of the inter-deck plug, and being in contact with the inter-deck dielectric layer on a lateral surface and a vertical surface.

12. The 3D memory device of claim 11, wherein a lateral dimension of the channel plug is greater than that of the inter-deck plug.

13. The 3D memory device of claim 2, wherein the inter-deck plug comprises at least one of amorphous silicon, polysilicon, or single-crystal silicon.

14. The 3D memory device of claim 4, wherein the inter-deck plug comprises single crystal silicon.

15. The 3D memory device of claim 2, wherein:
the first memory deck extends from a first one of the gate conductive layers intersecting with the first channel structure to a last one of the gate-to-gate dielectric layers intersecting with the first channel structure; and the second memory deck extends from a top surface of the NAND memory string to a last one of the gate conductive layers intersecting with the second channel structure.

16. The 3D memory device of claim 4, wherein:
the first memory deck extends from a first one of the gate conductive layers intersecting with the first channel structure to a last one of the gate-to-gate dielectric layers intersecting with the first channel structure; and
the second memory deck extends from a top surface of the NAND memory string to a last one of the gate conductive layers intersecting with the second channel structure.

17. The 3D memory device of claim 7, wherein:
the first memory deck extends from a first one of the gate conductive layers intersecting with the first channel structure to a last one of the gate-to-gate dielectric layers intersecting with the first channel structure; and
the second memory deck extends from a top surface of the NAND memory string to a last one of the gate conductive layers intersecting with the second channel structure.

18. The 3D memory device of claim 7, wherein the gate-to-gate dielectric layers comprise a silicon oxynitride layer and pair of silicon oxide layers, the silicon oxynitride layer being between the pair of silicon oxide layers, and in each of the gate-to-gate dielectric layers, a top surface of the silicon oxynitride layer being fully covered by one of the silicon oxide layers, and a bottom surface of the silicon oxynitride layer being fully covered by another of the silicon oxide layers, along the lateral direction.

19. The 3D memory device of claim 4, wherein the gate-to-gate dielectric layers comprise a silicon oxynitride layer and pair of silicon oxide layers, the silicon oxynitride layer being between the pair of silicon oxide layers, and in each of the gate-to-gate dielectric layers, a top surface of the silicon oxynitride layer being fully covered by one of the silicon oxide layers, and a bottom surface of the silicon oxynitride layer being fully covered by another of the silicon oxide layers, along a lateral direction, the lateral direction being perpendicular to a vertical direction that the NAND memory string extends.

* * * * *